United States Patent [19]

Lam et al.

[11] Patent Number: 5,694,481
[45] Date of Patent: Dec. 2, 1997

[54] AUTOMATED DESIGN ANALYSIS SYSTEM FOR GENERATING CIRCUIT SCHEMATICS FROM HIGH MAGNIFICATION IMAGES OF AN INTEGRATED CIRCUIT

[75] Inventors: Larry Lam, Russell; George Chamberlain, Carleton Place; Alexei Ioudovsky, Ottawa; Ghassan Naim, Gloucester, all of Canada

[73] Assignee: Semiconductor Insights Inc., Kanata, Canada

[21] Appl. No.: 420,683

[22] Filed: Apr. 12, 1995

[51] Int. Cl.$^6$ ........................................ G06K 9/00
[52] U.S. Cl. ........................................ 382/145; 382/294
[58] Field of Search ........................... 364/489, 490, 364/491; 395/921; 382/141, 145, 151, 284, 294

[56] References Cited

U.S. PATENT DOCUMENTS

| | | | |
|---|---|---|---|
| 4,790,027 | 12/1988 | Scherl | 382/54 |
| 4,791,586 | 12/1988 | Maeda et al. | 364/491 |
| 5,086,477 | 2/1992 | Yu et al. | 382/8 |
| 5,191,213 | 3/1993 | Ahmed et al. | 250/310 |
| 5,222,158 | 6/1993 | Takasaki et al. | 382/44 |
| 5,224,178 | 6/1993 | Madden et al. | 382/50 |
| 5,463,561 | 10/1995 | Razdan | 364/489 |
| 5,465,163 | 11/1995 | Yoshihara et al. | 358/444 |

*Primary Examiner*—Andrew Johns
*Attorney, Agent, or Firm*—E. E. Pascal; R. A. Wilkes

[57] ABSTRACT

A method of analyzing at least a portion of an integrated circuit (IC) comprised of the steps of automatically: (a) scanning at least a portion of a layer of an integrated circuit using high magnification to provide first digital signals representing pixel amplitudes, (b) extracting features of interest from the first digital signals to provide second digital signals representing values of groups of pixels defining the features of interest, (c) modifying the second digital signals representing adjacent features of interest from step (b) so as to mosaic the features of interest and providing third signals representing a seamless representation of the layer, (d) repeating steps (a), (b) and (c) for other layers of the integrated circuit, whereby plural third signals representing plural ones of the layers are provided, (e) registering the plural third signals relative to each other so as to represent vertical alignment of the layers by determining features of interest representative of IC mutual interconnection locations between layers, and using the locations as control points for the registering, and establishing an integrated circuit layout database therefrom, (f) generating a netlist from data signals defining the cells, and (g) generating a schematic diagram of a circuit contained in the integrated circuit from the netlist.

47 Claims, 13 Drawing Sheets

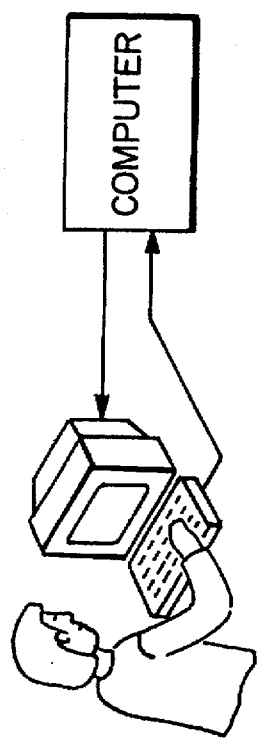
PRIOR ART
FIG. IB
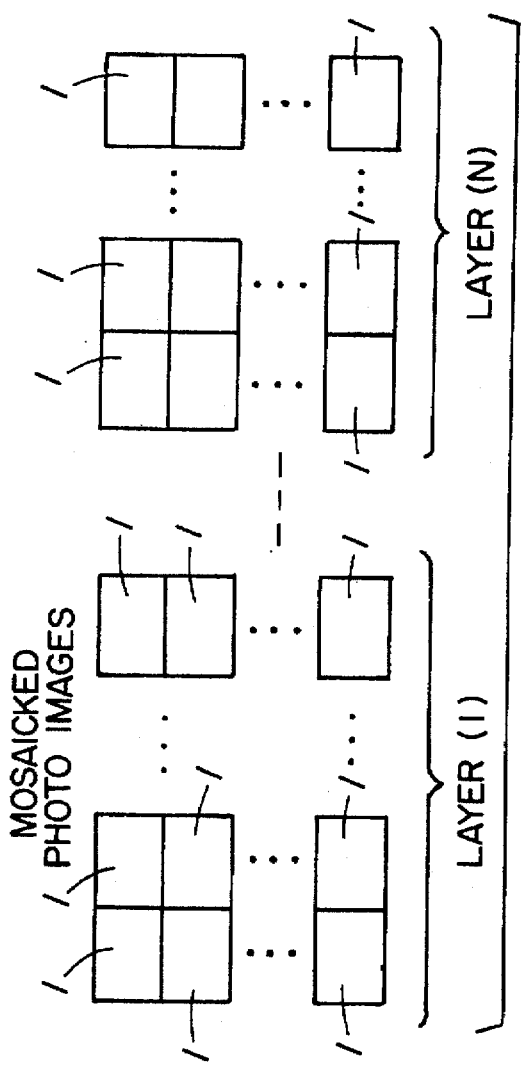
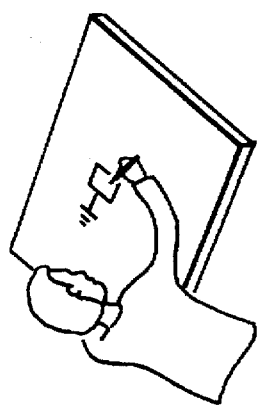
PRIOR ART
FIG. ID
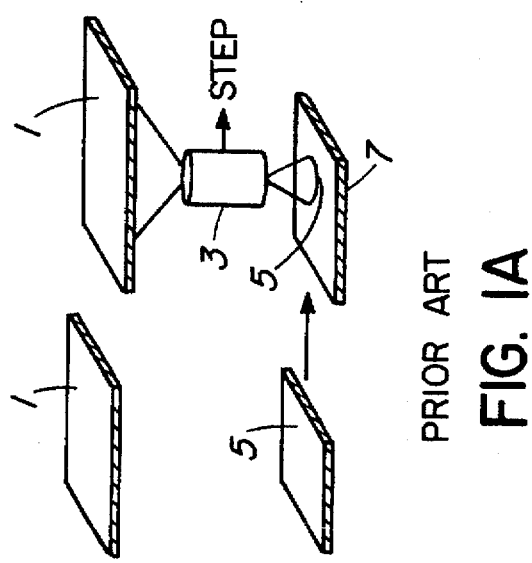
PRIOR ART
FIG. IA
PRIOR ART
FIG. IC

U/u = UNIQUE XY OFFSET VALUES
uc/UC = CALCULATED UNIQUE XY OFFSET VALUES 5,694,481

AUTOMATED DESIGN ANALYSIS SYSTEM FOR GENERATING CIRCUIT SCHEMATICS FROM HIGH MAGNIFICATION IMAGES OF AN INTEGRATED CIRCUIT

FIELD OF THE INVENTION

This invention relates to the field of semiconductor integrated circuit structure analysis.

BACKGROUND TO THE INVENTION

In the intensely competitive field of microelectronics, detailed analysis of a semiconductor integrated circuit product can provide valuable information as to how a particular technical problem was dealt with, overall strengths and weaknesses of a design approach, etc. This information can be used to make decisions regarding market positioning, future designs and new product development. The information resulting from analysis of the product is typically provided through circuit extraction (reverse engineering), functional analysis and other technical means. At the core of this activity is the process of design analysis which, in this context, refers to the techniques and methodology of deriving complete or partial simulated schematics, starting with essentially any type of integrated circuit in any process technology. For such technical information to be of strategic value it must be accurate and cost-effective, and it is very important that the information should be timely.

A design analysis process typically involves skilled engineers manually extracting circuit information from a set of large "photomosaics" of an integrated circuit (IC). Skilled technicians and engineers perform the following sequential manual tasks, with reference to FIG. 1A and FIG. 2:

(1) Capture Image
  (i) a high magnification photograph 1 is taken, using a camera 3, of a small portion 5 of an IC 7 which has been processed to expose a layer of interest.
(2) step (i) is repeated for all of various regions of interest of the layer of the IC, ensuring that sufficient overlap exists between adjacent photographs that will be used to create photomosaics.
(3) Create Photomosaics
  (ii) all adjacent photographs associated with the given IC layer are aligned and taped together.
(4) steps (1)–(3) are repeated for all layers (1)–(N) necessary construct a layout database of the IC as shown in FIG. 1B. All layers include interconnect layers. For example, four sets of photomosaics are required for a state-of-the-art microprocessor employing four layers of interconnect: three layers of metal and one layer of polysilicon.
(5) Extract Circuit
  (iii) transistors, logic gates and other elements employed in the IC are identified by manually visually examining the polysilicon and lower metal interconnect photomosaics.
  (iv) interconnections between circuit elements of (iii) are traced and this information is captured in the form of schematic drawings as shown in FIG. 1C.
  (v) drawings of (iv) are manually checked against the photomosaics and any obvious errors are corrected.
(6) Organize Schematic
  (vi) the drawings of (v) are organized into hierarchical functional/logical blocks.
(7) Capture Schematic
  (vii) the drawings of (vi) are entered into a computer as shown in FIG. 1D using computer aided engineering (CAE) software tools for subsequent simulation and functional analysis of the IC.

The aforenoted manual process used today has major limitations. The photomosaics alone for devices of current complexity are very expensive and can take many months to create. The circuit extraction task is labour intensive, tedious and error-prone. As IC device geometries shrink toward 0.1 micron and levels of integration move toward the equivalent of 1 billion transistors on a single device, the current manual process for full-chip design analysis will become impractical.

In order to overcome the above-described manual process, automated systems have been designed. Such systems are described in U.S. Pat. No. 5,086,477 issued Feb. 4th, 1992 to Kenneth K. Yu et al and U.S. Pat. No. 5,191,213 issued Mar. 2nd, 1993 to Haroon Ahmed et al.

In the system described in U.S. Pat. No. 5,086,477, the integrated circuit chip is scanned by a microscope or scanning electron microscope (SEM). The system identifies every unique cell and/or gate used in the integrated circuit. An unique abstract representation is created for each of these unique cells or gates, which are stored in a library.

However, without any operator guidance, the system cannot know where the boundary of a cell lies. While the patent suggests the use of diffusion edges to define cell boundaries, it appears that the only way that this can be done is by manual operator direction.

In the patented system, once all unique cells have been captured in a reference library, the system attempts to associate and match all abstract features contained in the layout data base to the cells in the reference library using classical template matching. However because of the magnitude of data contained in a layout data base for a typical modern integrated circuit, even after the data has been compressed, the processing time required to reliably extract a netlist is excessive, and the patent therefore teaches that the tasks should be (manually) operator directed. The difficulty and time required for the operator directed process becomes very difficult with a large number of cells or gates, since the number of template matching operations increases exponentially with the number of reference cells and/or gates.

Once all reference cells in the patented system have been template matched to the data base, theoretically all features in the layout data base will have been grouped and classified and a netlist can be constructed. If there are features of the layout data base that have not been classified, either the system must construct a new cell or gate to be added to the reference library and an operator is informed, or the operator is informed by the system and the operator performs this task. The cell to cell interconnect information extraction, which is required to construct a netlist, is said to be performed using template matching, which is very inefficient.

Due to the template matching approach that is required, the patented system must be limited to gate-array or very structured standard cell integrated circuit analysis in which the large majority of the cells are identical, and therefore as the size of the integrated circuits increase, its efficiency decreases. It is therefore inefficient for analysis of modern ASICs or custom integrated circuits, large and/or complex integrated circuits. The patented system would also be limited to applications where many devices from a few ASIC manufacturers are investigated, due to the investment and time required to develop separate reference libraries, e.g. related to a different set of design rules.

U.S. Pat. No. 5,191,213 relates to a technique for removing layers of an integrated circuit and for scanning each of the layers, and does not appear to be an automated system.

SUMMARY OF THE INVENTION

The present invention overcomes the shortcomings of the above-described prior art manual design analysis process and the systems and processes described in the aforenoted patents by automating the entire process, including image capture, photomosaic, circuit readback, circuit organization and schematic capture tasks. Automation presents many problems which are solved by the present invention. The present invention can provide a complete analysis of an integrated circuit design in days or weeks (depending on the size of the integrated circuit), rather than the much greater time required in the prior art processes, months in the case of the manual process.

Further, the present invention substantially eliminates the errors caused by manual operation and analysis used in the prior art process.

The present invention does not require comparison of a pixel-based scanned image with a stored image in order to define the integrated circuit cells, gates, etc. Indeed, an unique automatic technique for generating vectors, and joining the vectors to provide unified integrated circuit features is utilized.

In addition, we have designed an unique mosaicking process of scanned portions of the integrated circuit which can deal with cases in which there are no unique and/or no orthogonal offset solutions. In addition, the present invention provides an unique automatic mosaicking function wherein the amount of data is so compressed that it can be handled by a desk-top computer.

The present invention is thus significantly more economical in the time required for processing the data, in the hardware requirements to process the data, and in the efficiency of layout extraction in respect of modern very large and complex integrated circuits, than are the prior art systems and method.

With reference to the flow chart of an embodiment of the present invention shown in FIG. 4, the present invention is comprised of the following sequentially automated steps:

(I) Image Capture
  (a) Record Image
    (i) capture an electronic high magnification image (pixel data) of a small portion of the IC.
    (ii) minimize noise introduced by the capture device into the image.
  (b) Feature Extraction
    (iii) separate IC layer information from background information in the image of (ii).
    (iv) convert the image of (iii) from a pixel representation into a polygon representation.

(II) If step (I) has been finished with respect to an area repeat (I) for all of the various regions of interest for the IC ensuring sufficient overlap between adjacent images for horizontal registration. Review and correct all errors identified by the feature extraction process steps.

(III) Horizontal Mosaicking
  (v) create a composite layer image from all of the polygon layer images of (iv) by horizontally registering the polygon layer images.
  (vi) review all errors identified by the Horizontal Mosaicking process steps.

(IV) Constructing Database
  (a) repeat steps (I) to (III) for all layers necessary to construct a layout database of the IC.

(V) Layout Reconstruction
  (vii) create a composite layout database from all of the composite layer images of (v) by vertically registering the composite layer images.
  (viii) re-partition boundaries and consolidate all layer information into one file for each image (cell) in the composite layout database of (vii) to simplify task (x) below.

(VI) review and correct all errors identified by the layout reconstruction process steps.

(VII) Schematic Generation
  (x) extract an electronic netlist from the re-partitioned composite layout database of (viii) using commercially available IC layout verification EDA tools.

(VIII) re-partition netlist of (x) to reconstruct gate/cell and higher levels of hierarchy of the IC.

(IX) synthesize a schematic database from the hierarchical netlist of (xi) using EDA design entry tools well known to those skilled in the art.

In accordance with an embodiment of the invention, a method of analyzing an integrated circuit (IC) is comprised of the steps of automatically: (a) scanning a layer of an integrated circuit using high magnification to provide first digital signals representing pixel amplitudes; (b) extracting features of interest from the first digital signals to provide second digital signals representing values of groups of pixels defining the features of interest; (c) modifying the second digital signals representing adjacent features of interest from step (b) so as to mosaic the features of interest and providing third signals representing a seamless representation of the layer; (d) repeating steps (a), (b) and (c) for other layers of the integrated circuit, whereby plural third signals representing plural ones of the layers are provided; (e) registering the plural third signals relative to each other so as to represent vertical alignment of the layers; and establishing an integrated circuit layout database therefrom; and (f) generating a schematic diagram of a circuit contained in the integrated circuit from the database.

BRIEF INTRODUCTION TO THE DRAWINGS

A better understanding of the invention will be obtained by reading the description of the invention below, with reference to the following drawings, in which:

FIG. 1A is a view of a prior art system for capturing magnified images of portions of an IC, FIG. 1B illustrates manual mosaicking of images captured in FIG. 1A, FIGS. 1C and 1D illustrate additional steps in a prior art process, FIG. 2 is a flow chart illustrating an embodiment of the prior art, FIG. 3 is a block diagram illustrating apparatus that can be used to perform the present invention, FIG. 3A is an illustration of a scanned image of an IC, FIG. 3B is an illustration of a segmented image of the image of FIG. 3A, FIG. 4 is a flow chart illustrating the present invention, FIG. 5 is a flow chart of a segmentation process using a Sobel filter, FIG. 6 is a flow chart of a segmentation process using a dispersion filter, FIG. 7 is a flow chart of another segmentation process using a dispersion filter, FIG. 8 is a flow chart of a combined segmentation process using the processes of FIGS. 5, 6 and 7, FIG. 9 is a flow chart of a polygon generating process, FIG. 10 illustrates mosaicking and formation of cells, FIG. 11 illustrates four adjacent images to be mosaicked with their adjacent boundaries, FIG. 12 illustrates clipping a window sub-image to the same size as a template sub-image, FIG. 13(a)–13(g) illustrates the steps of determining offset values of quad image sets by an exception handling process, FIG. 14 is a flow chart illustrating a process of mosaicking image sets, FIG. 15 is a flow chart illustrating a vertical registration process, and FIG. 16 is a flow chart illustrating a process of layout of cells.

DETAILED DESCRIPTION OF THE INVENTION

Figure 2:
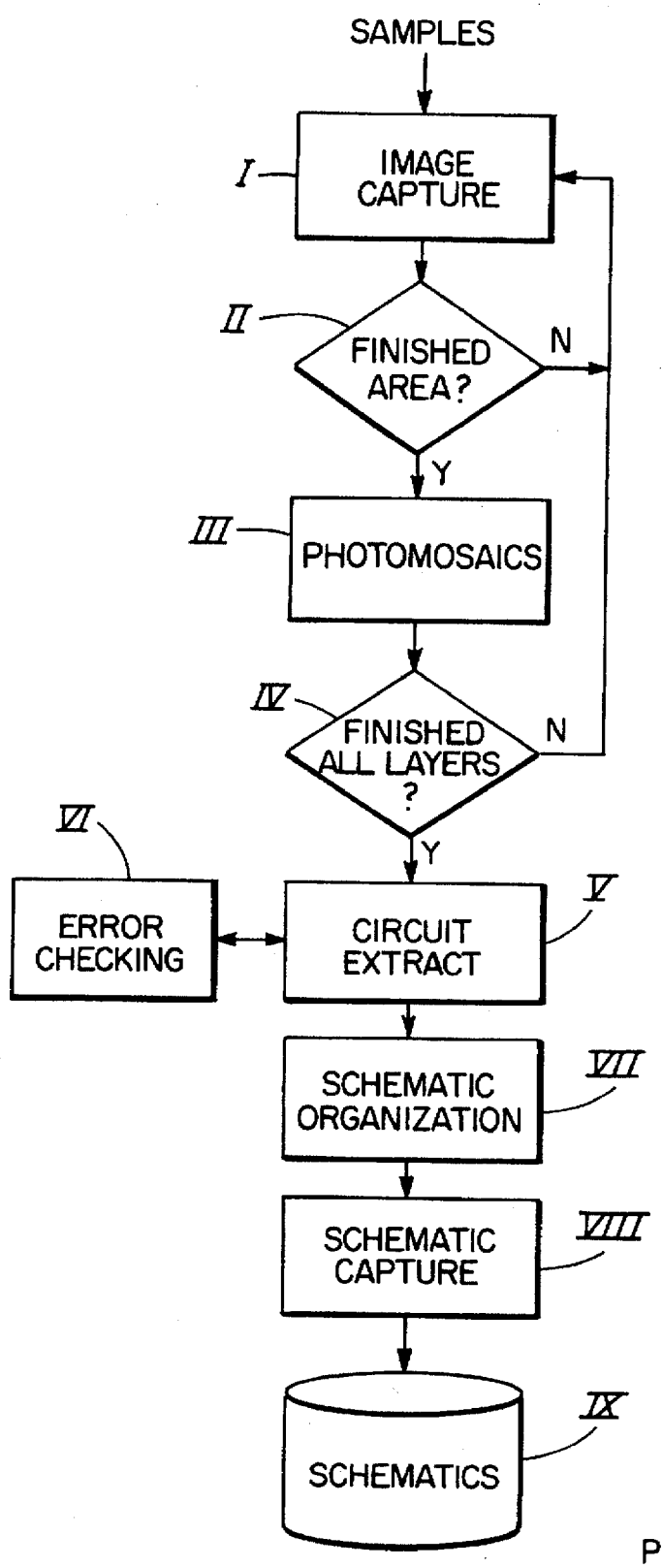
Figure 3:
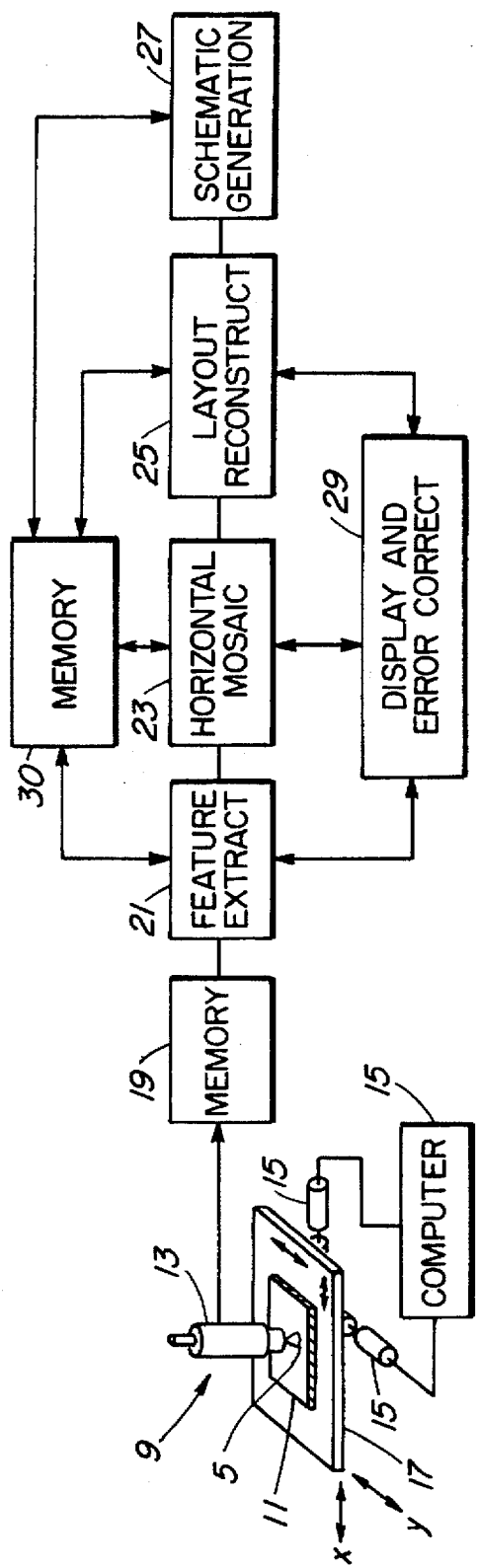

The present invention can be performed on a system illustrated in FIG. 3. The corresponding steps performed by the system are shown in the flow chart of FIG. 4. The system is comprised of an image acquisition apparatus 9 for acquiring electronic high magnification image sets in pixel data form (process X in FIG. 4) of an IC 11 in an automated manner. Multiple image sets will be acquired for an IC, one each for the IC de-layered to its top metal layer, intermediate metal(s) layer(s), intermediate poly(s) layer(s), poly gate layer and diffusion.

The preferred form of the image acquisition apparatus is comprised of a scanning electron microscope 13 (SEM) with a digital image capture target, and having a stage 17 for supporting the IC 11 which has high-precision computer controlled orthogonal X and Y direction stepping controls 15. By stepping the stage 17 so that small surface regions of the IC 11 are scanned, high magnification images of those regions are acquired in an automated manner. An external stage 17, such as used with a light image microscope is shown for clarity, but it will be recognized that the stage used in an SEM is internal to the SEM vacuum chamber. However, any suitable kind of imaging system can be used.

The input parameters required by the forthcoming feature extraction, mosaicking and layout reconstruction steps are determined by an image characterization process.

Preferably warp/de-warp process steps should be used to minimize geometric and other distortions introduced by the imaging apparatus. Pixel and other data resulting from the above are stored in a memory 19. For example, pixel amplitudes are stored.

The features of interest, e.g. the top-most features in an image should be distinguished from the remaining features in that image (e.g. background) in a feature extraction process XI in a subsystem 21 and those features should be converted from a pixel to a polygon representation in preferably a standard GDSII file format. Feature extraction should be performed on every image acquired by the image acquisition system 9 in real and/or near real time in subsystem 21.

Figure 3B:
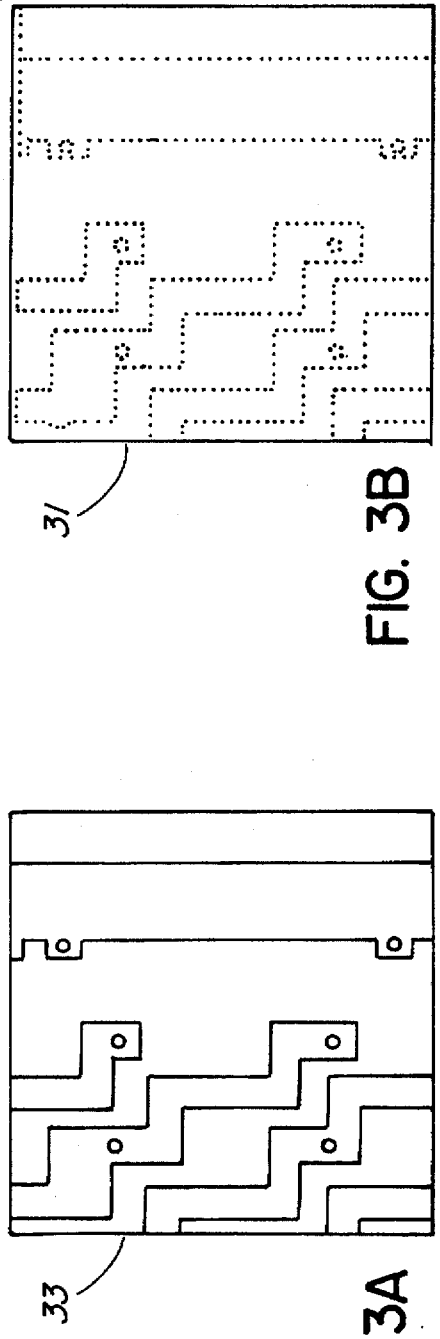
Figure 3A:
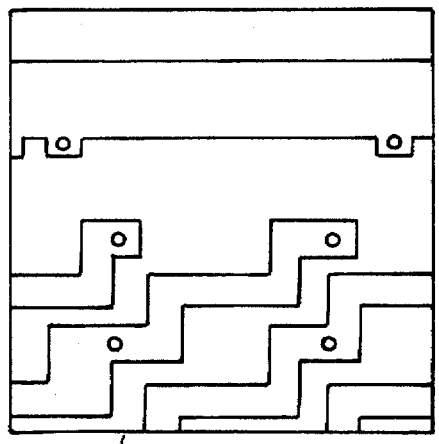

The feature extraction process steps preferably are comprised of:

(i) Segmentation for separating the features of interest in an image (e.g. edge lines 31 as shown in FIG. 3B from scanned image 33 of the IC shown in FIG. 3A) from their background and eliminating the background information from the image. Features of interest are usually the features containing the top-most semiconductor layer information in an image. For example, for a top metal image, an image containing top metal interconnect and via information only should be created.

(ii) Polygon generation for converting the segmented image format from a pixel to a polygon representation in preferably a GDSII file format.

Horizontal mosaicking process steps XII, carried out by a horizontal mosaicking subsystem 23, should be used to register together adjacent feature extracted images within an image set representing a horizontal layer of the IC to create a seamless representation of a semiconductor layer e.g. top metal. The mosaicking process steps XII are preferably comprised of:

(i) Selection of 4 images (a Quad set) within an image set to be mosaicked.

(ii) Calculation of Quad XY offset distances for determining XY axis coordinate offsets between two adjacent images in a Quad set which minimize registration error between image pairs.

(iii) Identification of exceptions for determining whether a sufficient number of unique XY offsets exist for a Quad set and directing further processing to an exception handler process if there is not, and to the Quad overlap eliminator process if there is a sufficient number of unique XY offsets.

(iv) The exception handler process is used to determine indirectly the unique XY offsets for a Quad set in order to satisfy the requirements of the exception identifier.

(v) The Quad overlap eliminator process is used to eliminate overlap between image pairs in a Quad set after applying XY offsets and to create a hierarchical "cell" representation of the four images.

Layout reconstruction XIII is preferably performed by a layout reconstruction subsystem 25 and is used to create an IC layout database by vertically registering the mosaicked image sets (in depth with respect to the IC), to re-define the image boundaries for each image in the lowest layer, i.e. the diffusion image set, to eliminate image boundaries cutting through diffusion regions of that layer, to re-define the image boundaries for each image in all other image sets to align them with the image boundaries of the corresponding image in the diffusion image set and to consolidate all image set data associated with each image.

The layout reconstruction process steps are comprised of:

(i) Vertical registration for vertically registering each mosaicked image set to it's vertically adjacent mosaicked image sets using via and/or contact locations as the registration control points.

(ii) Layout cell generation for redefining image boundaries for the diffusion image set so that transistors are not split between images or cells and for consolidating all layer information associated with an image into one file, i.e. producing a cell layout database file.

Schematic generation XIV is performed by schematic generation subsystem 27 and is used to generate a netlist from the IC layout database representation of the IC, extract gate and cell level and possibly higher levels of hierarchical information, and generate a graphical schematic representation from the hierarchical netlist.

The schematic generation process steps are comprised of:

(i) Netlist extraction for extracting transistor and/or element level netlist representation of the IC from the IC layout database.

(ii) Hierarchy reconstruction for reconstructing gate and/ or component and possibly higher levels of hierarchy and for creating a hierarchical netlist.

(iii) Schematic creation for synthesis of a graphical schematic database from the hierarchical netlist.

Image layout display process XV, performed by a display and error checking subsystem 29, is used by an operator to display intermediate results for resolving errors or uncertainty flagged by each of the feature extraction, mosaicking and layout reconstruction processes. The image layout and display subsystem can be a type DW-2000 IC layout editor which is sold by Design Workshop, 4226 St. John's, Suite 400, P.D.O., Quebec, H9G 1X5, Canada, customized to allow the display of a pixel image of the images in the background.

In summary, the preferred embodiment of the present invention is comprised of the following processes: (i) Image Acquisition, (ii) Feature Extraction, (iii) Horizontal Mosaicking, (iv) Layout Reconstruction, and (v) Schematic Generation. These processes can be carried out by the apparatus illustrated in FIG. 3, or, except for the image acquisition apparatus (e.g. the SEM), by a computer workstation. It will be recognized by a person skilled in the art that the elements of the system of FIG. 3 will store and access data being processed in a database in a memory 30 (or equivalent plural memories).

The image acquisition process is preferably comprised of the processes of (i) Image capture, (ii) Image calibration, and (iii) Warping and/or De-warping.

The image capture process captures high magnification images of small areas 5 of a die of an IC in an unattended automated manner once an operator has performed the setup and calibration procedures. With reference to FIG. 3, the image capture apparatus 9 such as SEM 13 acquires an image, and under control of computer and stepping motors 15, moves the stage 17 a predetermined distance in the X and/or Y direction. It then acquires another image and continues to repeat the above until images of the die or a predetermined area of a die have been acquired completely. The image capture apparatus 9 includes control apparatus (not shown) which automatically maintains SEM functions at optimum values for focus, astigmatism correction, contrast & brightness and accelerating voltage; and ensures that the XY stage movements are accurate and result in a consistent overlap between adjacent images.

In addition, the image capture apparatus stores a compressed form of the image in a memory 19, such as a hard disc drive for future reference by the image layout and display apparatus.

The image capture apparatus is preferably comprised of an SEM 13 equipped with an $LaB_6$ electron source, low and high accelerating voltage ranges, auto functions such as focusing, astigmatism correction, contrast and brightness, and an eucentric, goniometer motorized computer 15 controlled stage 17 with absolute placement accuracy of better than 1 micron and user definable unattended stage movement pattern e.g. raster pattern, and an active digital image acquisition system capable of acquiring at least a 1K×1K pixel image and control and storage means to automatically coordinate the above.

The above image acquisition system is sold as a model 1000 Image Acquisition System by Seimicaps Inc. of Suite 2084-B, Wash Avenue, Santa Clara, Calif., 95050, U.S.A.

The image calibration should be used to determine parameters used by the warping/de-warping, feature extraction, mosaicking and layout reconstruction processes. This calibration process should be executed once per image session, prior to actual image capture.

Warping/de-warping characterizes and corrects an image for any geometric distortion introduced into the image by the image acquisition process steps. A potential major source of distortion can originate from the SEM column deflection electronics, typically resulting in a barrelling or pin cushioning effect on an image especially at lower magnification settings. As noted above, warping/de-warping calibration should be performed once per image acquisition session and should be executed prior to actual image capture.

To perform the calibration, a calibration waffle should be imaged at a magnification setting consistent with a setting to be used to acquire actual images. The distortion is then measured. If the maximum distortion is less than preferably three pixels, no de-warp transform is defined. If the maximum distortion is greater than preferably three pixels, a de-warp transform is defined and used by the warp/de-warp process steps to modify the image in a direction so as to linearize it, in a well known manner.

Feature extraction, mosaicking & layout reconstruction calibration process should be used to determine optimum parameters for the feature extraction, mosaicking and layout reconstruction processes. More specifically, this process is used to determine the following defined parameters (which will be described in more detail later in this specification):

(i) For the feature extraction process: T0, T1, T2, T3, TS, TG, D1CL, D2CL, SBCL
(ii) For the mosaicking process: OL
(iii) For the layout reconstruction process: MFS, MIW.

Image calibration should be comprised of the following sequential steps:

(i) Determine an optimum SEM magnification from prior determination of a minimum feature size on the die, e.g. the magnification that yields five pixels between the edges of a minimum size feature.

(ii) Power up the image acquisition apparatus 9 and allow its electronics to stabilize.

(iii) Place a calibration sample into the SEM chamber, adjust the position of the sample so that it lies flat (0 deg. tilt) and square (to the XY stage movement) on the stage and acquire an image at the magnification value determined in (i) above. Execute the warp/de-warp calibration process.

(iv) Remove the calibration sample and place the IC die sample into the chamber on the stage, and adjust the position of the die so that it lies flat (0 deg. tilt) and square (to the XY stage movement).

(v) Set the SEM magnification to the value determined in (i) and adjust the SEM functions such as accelerating voltage, focus, astigmatism correction, contrast and brightness to yield optimum parameters for the feature extraction and layout reconstruction modules.

(vi) Determine the appropriate X and Y stage displacements (taking into account positioning error of the stage and overlap requirements for the mosaicking process), XY limits and image capture scan pattern.

(vii) Test the SEM and XY stage parameters using the feature extraction, mosaicking & layout reconstruction calibration process.

(viii) Repeat (v)–(vii) until optimum parameters are determined.

As noted above, warping/de-warping is used to correct an image for barrel or pin cushion distortion introduced by the SEM. This process executes on all images acquired by the image acquisition process during an image acquisition session if a de-warp transform has been defined by the image calibration process.

Feature extraction process steps consists of two processes: (i) segmentation, and (ii) polygon generation.

Segmentation separates the foreground information (i.e. the semiconductor layer of interest e.g. M1 for a top metalization layer M1 image) from the SEM scanned image stored in memory 19 and converts the foreground information into a preferably binary 4 connected one pixel wide contour image. Reference is made to FIG. 3B for an example of segmented image derived from an example of the scanned image shown in FIG. 3A.

In general, segmentation identifies the areas of the scanned image which appear uniform, and subdivides the image into the regions of uniform appearance. An operator on the image data which is sensitive to pixel value gradients followed by a threshold operator (edge detection) can be used to determine raw segmentation data. An edge enhancement process then should be used to link the edges and to eliminate any noise.

Preferably one of two techniques are used to detect edge data in an image: Sobel filter (FIG. 5) and dispersion (FIG. 6). The choice of technique used is determined during the image calibration task. The edge enhancement process utilizes the gradient image (output of Sobel filter or dispersion filter) when performing edge linking.

Figure 5:
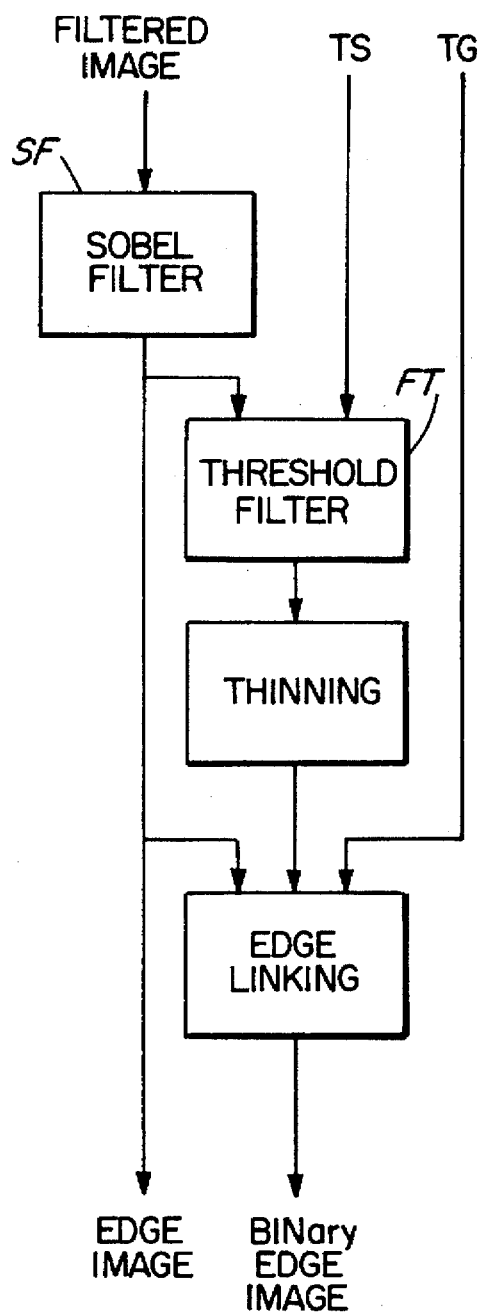
Figure 6:
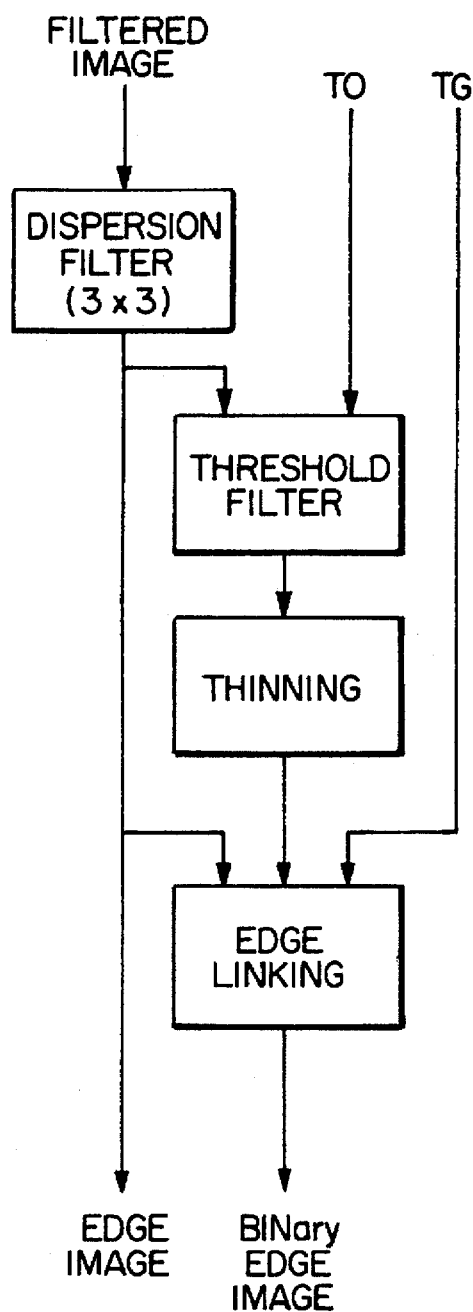

With reference to FIG. 5, image data is passed through a Sobel filter. The Sobel filter produces a grey level image which is proportional to the gradient (first derivative) of the input grey level image. Therefore a Sobel filter can be used to identify boundaries between regions with different intensity levels within an image, and produces an edge image which is provided to the edge linking step. A Sobel filter however is very sensitive to noise and to small variations in intensity making it difficult to separate strong edges from the weak. Non-linear stretching of contrast should be used to improve the data passed through the filter, but some noise may still result in a thresholded image. A Sobel filter should therefore be used for segmenting clean images i.e. images that are relatively free of noise and considerable variations of intensity within lines or background.

With reference to FIG. 6, the dispersion operator can be used as an edge detector. Dispersion operates on local data within an area defined by the kernel size. Each pixel of the original image is substituted by the dispersion of intensity in the surrounding area specified by the kernel size.

The averaging and non-linear properties of dispersion make this process less sensitive to noise and is more robust to variations of intensity within an image as compared to the Sobel filter. Another important benefit of this technique is that non-linear stretching of contrast in the medium range of intensity can be used to detect features such as contacts and interconnect which do not have strong contrast.

The segmentation process is comprised of the following processes: (i) Median filter, (ii) Histogram stretching, (iii) D1CL process segmentation, (iv) D2CL process segmentation, and (v) SBCL process segmentation.

Median filter and histogram stretching processes are applied to all images followed by one of D1CL, D2CL or SBCL processes depending upon the parameters defined during the Image Calibration task.

Median filter and histogram stretching procedures are preferably used to pre-process the image. A median filter of a fixed kernel size is used to eliminate noise, which has the advantage of retaining sharp edges and filtering objects of size 0.5 the kernel size and less. Histogram stretching is preferably used to normalize as much as possible the images so that the D1CL, D2CL and SBCL segmentation processes can be generalized.

D1CL segmentation is one of two segmentation processes utilizing the dispersion technique. This process performs a dispersion with a single threshold followed by edge linking. Edge linking uses the gradient image to determine the link direction; there is no guarantee that edges for a feature will be contiguous or closed; gaps may exist. Edge closing is taken care of in the polygon generation process. Image calibration input parameters include (i) T0—into the threshold filter for thresholding, and (ii) TG—into the edge linking process for edge linking (and is normally set to 0).

Figure 4:
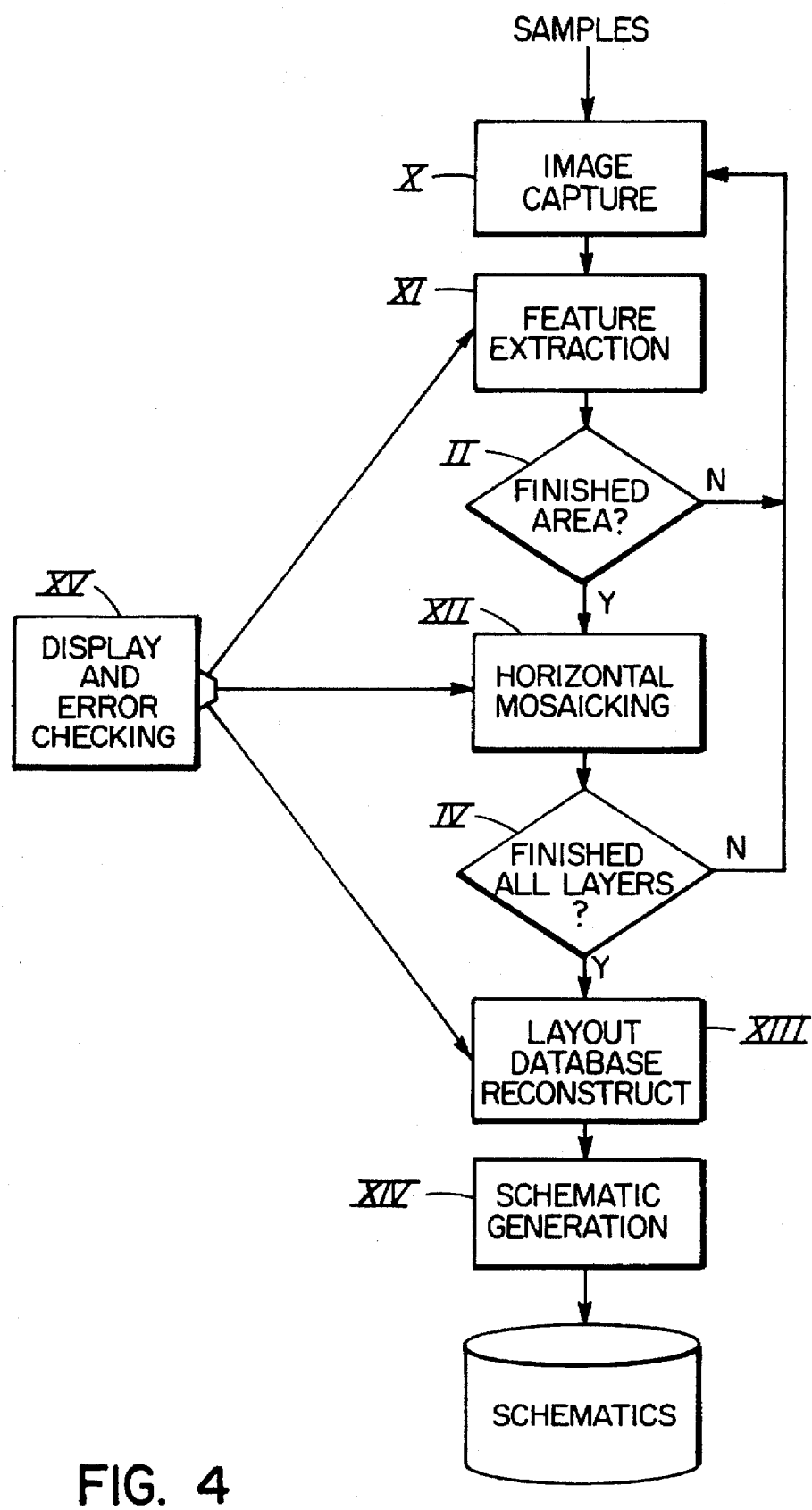

FIG. 4 is a flow chart of a D1CL segmentation process (using a dispersion filter). D1CL is the preferred process for most images because it has been shown to provide the most consistent results and takes the least time to execute.

Figure 7:
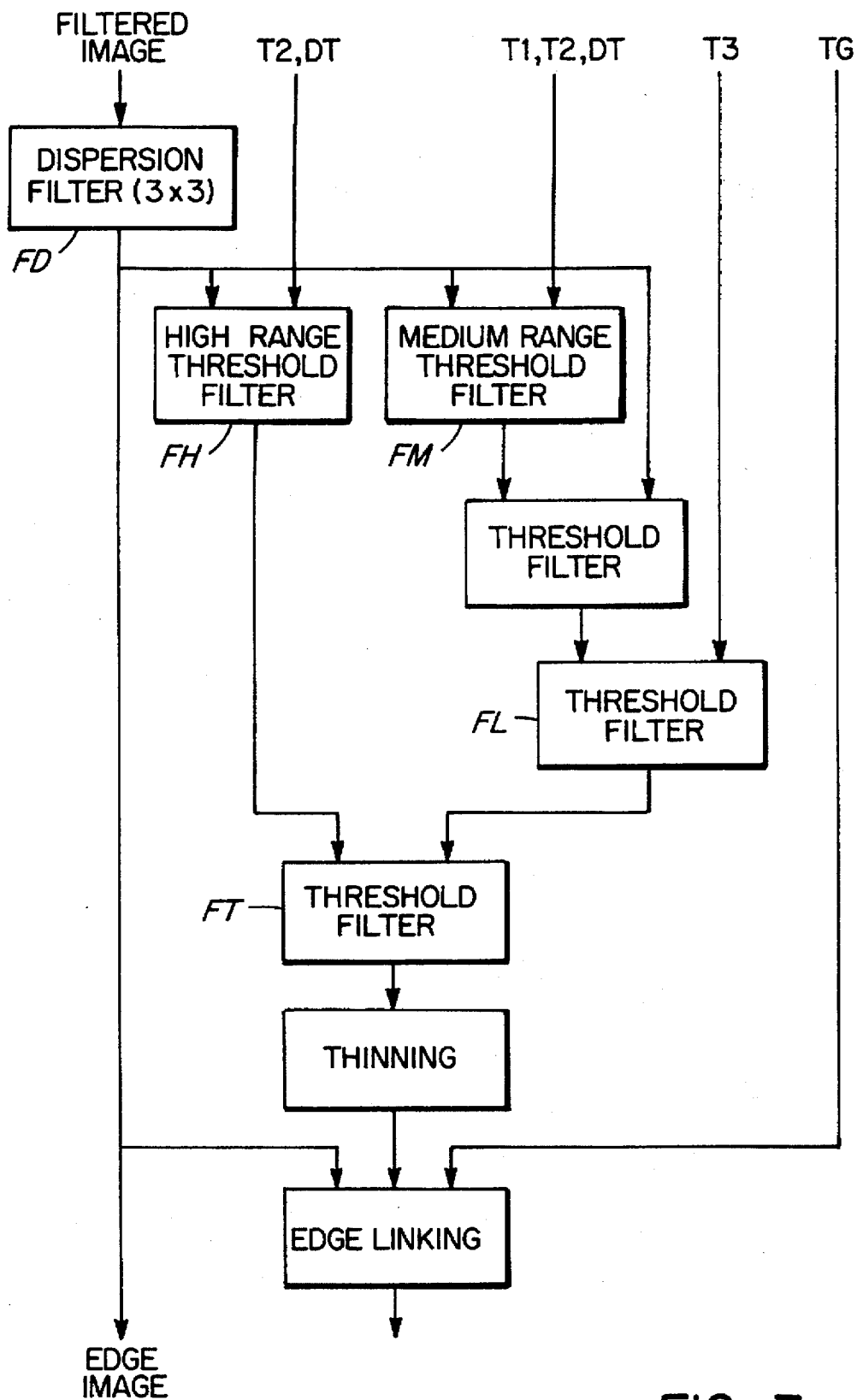

With reference to the flow chart of FIG. 7, the illustrated D2CL segmentation process is another segmentation procedure that utilizes the dispersion technique. The D2CL segmentation process is similar to the D1CL segmentation process except for the following:

(i) the range of intensity at the output of the dispersion filter FD is divided into two ranges: HIGH (T2 ... 255) and MEDIUM (T1 ... T2), by threshold filters FH and FM.

(ii) the features of an image with MEDIUM intensity range are then processed with a non-linear stretching operator (exponential) to increase the average difference of intensity between noise and low contrast features and subsequently thresholded (T3) by filter FL to extract the low contrast features.

(iii) the output image of filter FL is then combined with the image obtained after applying HIGH threshold T2, in filter FT.

Image Calibration input parameters to the aforenoted filters include:

(i) T1—for MEDIUM Thresholding
(ii) T2—for HIGH/MEDIUM Thresholding
(iii) T3—for MEDIUM Thresholding
(iv) TG—for edge linking (normally set to 0)

The process of FIG. 7 is the most robust relative to the processes of FIGS. 5 and 6 and should be used for images with low contrast. A laboratory prototype of the D2CL process took 1.6 times longer than the D1CL process and therefore it should be used only where necessary.

The segmentation process of FIG. 5 (referred to below as the SBCL process) is similar to the D1CL segmentation process of FIG. 6, except that it utilizes the Sobel filter technique. This procedure provides a Sobel filtered output signal filtered in threshold filter FT with a single threshold TS followed by edge linking. However there is no guarantee that edges for a feature will be contiguous or closed; gaps may exist. Edge closing is taken care of in the Polygon Generation process steps.

Image calibration input parameters include (i) TS—for the threshold filter FT, and (ii) TG—for edge linking (normally set to 0).

This process is the least robust of the three segmentation procedures but is the easiest to calibrate, requiring only one parameter. The SBCL process should be used if the image quality is high (i.e. high contrast, uniform distribution of intensity within features and substantially no noise) and image calibration is difficult. In a laboratory prototype, the SBCL process was 1.3 times slower than the D1CL process.

Figure 8:
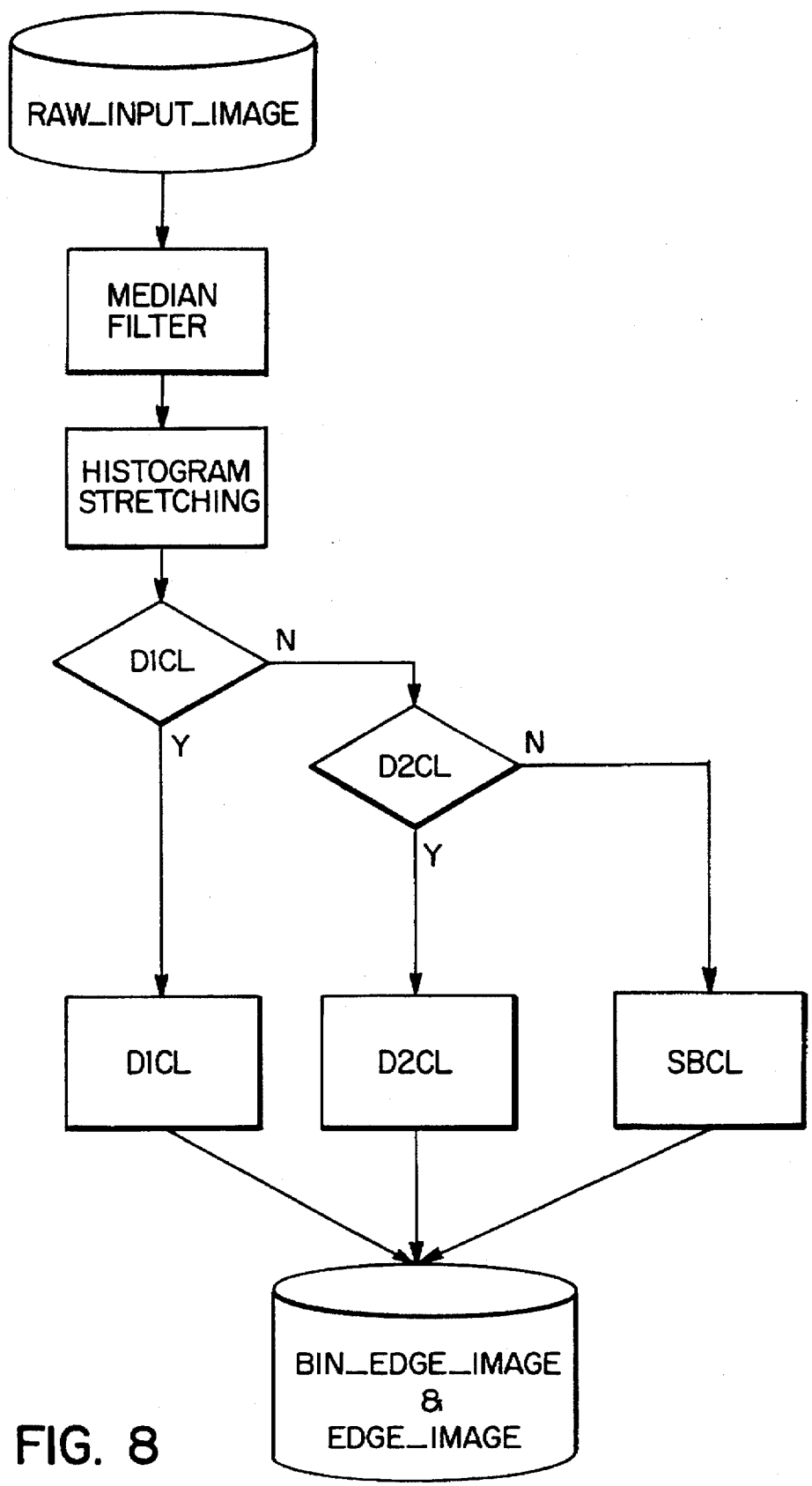
Figure 9:
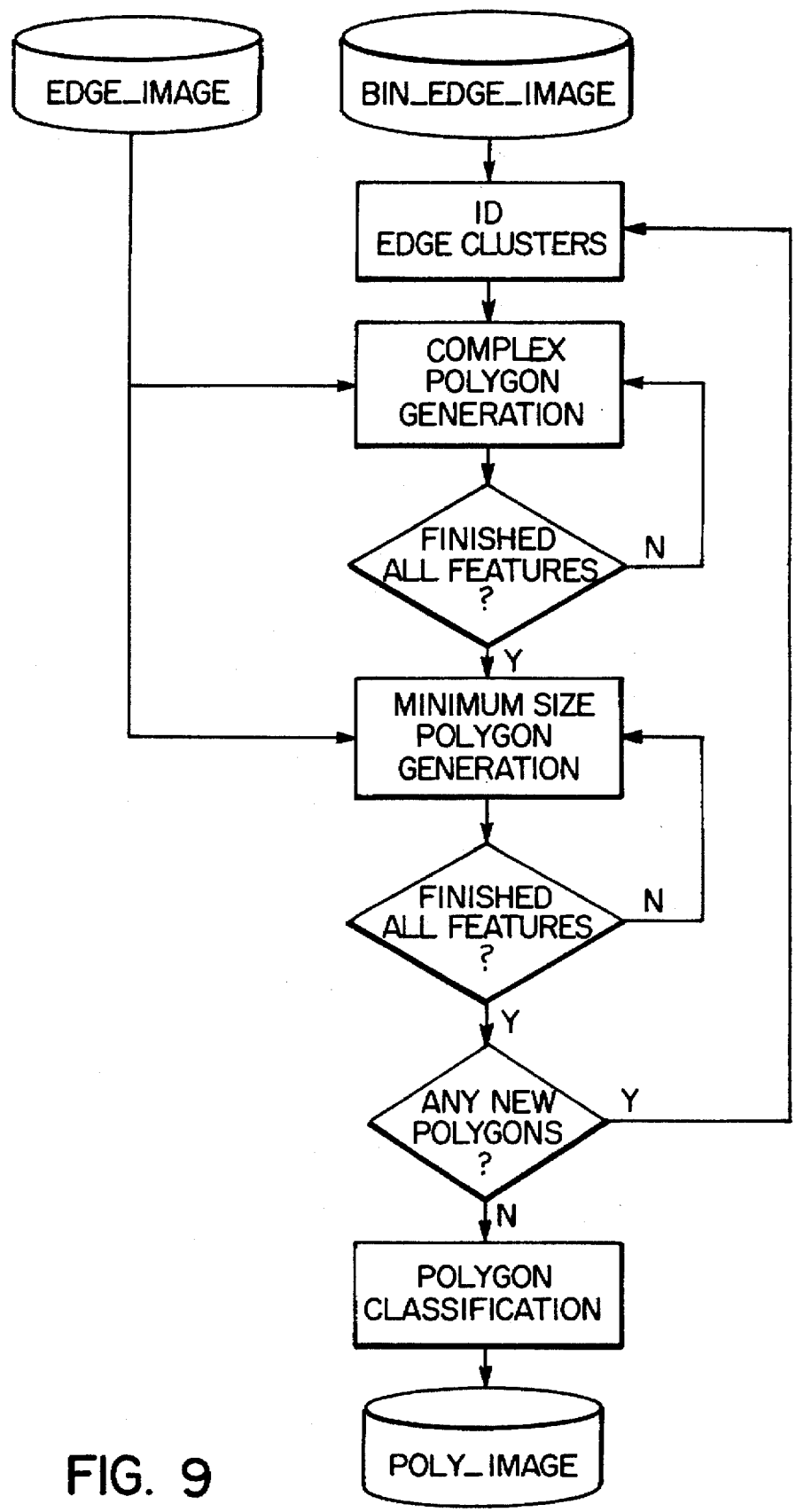

With reference to FIG. 8, the segmentation process is comprised of the following sequential steps:

(i) apply a median filter of kernel size m×m to the image data from the image acquisition process to eliminate or minimize noise.

(ii) apply histogram stretching to the image data resulting from step (i) to normalize the grey scale image.

(iii) using parameters (T0, T1, T2, T3, TS, TG, D1CL, D2CL, SBCL) determined by the image calibration process, execute one of the D1CL, D2CL or SBCL processes separating the foreground features from the image.

(iv) Store two resulting images (a 4 connected BINary EDGE IMAGE and a grey scale EDGE IMAGE) in memory and pass them to a polygon generation process.

The polygon generation process (FIG. 8) converts the segmented image, i.e. the binary 4 connected one pixel wide contour image (FIG. 3B) produced by the segmentation process steps, into a polygon image in a preferably GDSII file format.

The polygon generation process is comprised of the following processes: (i) Feature Identification, and (ii) Polygon Conversion.

The feature identification process is used to identify and uniquely label all "edge clusters". An "edge cluster" is defined as a group of contiguous binary 4 connected pixels. The feature identification process is a multi-pass procedure that identifies features via their connected components. In a first pass, all edge clusters are identified. Two arrays are used to mark any clusters that are initially indicated (and labelled) as being unconnected, and are then found to be connected. These equivalence classes are then resolved (clusters are merged). All clusters are then re-ordered from one to the total number of clusters. At this point a second pass through the image changes the pixel values in a cluster to reflect the cluster number. The last step is to include in the header portion of the image file, the number of edge clusters in the image.

The polygon conversion process is a multi-pass process that performs polygon generation and cluster linking (linking all edge clusters associated with a feature). The polygon generation and cluster linking attempts to join all clusters associated with a feature and to convert the feature into a polygon. Linking of clusters is based on following maximum gradients along the edges.

In a simple case, in which one edge cluster represents an entire feature, polygon generation is applied. Polygon generation is a contour following process wherein:

(i) a running error in X and Y directions is maintained.

(ii) when the running error becomes greater than one grid value for one grid value worth of SUCCESSIVE points, a vertex is placed and the running error is reset.

(iii) when the contour following returns to the first co-ordinate, polygon generation is complete and the feature is converted into a polygon.

In a complex case in which more than one edge cluster (i.e. breaks between clusters and noise) represents a feature, cluster linking is applied followed by polygon generation. Cluster linking joins two edge clusters and/or eliminates noise; specifically cluster linking takes care of the following three cases of:

(i) a simple gap between clusters.

(ii) a "T" junction.

(iii) a "bubble".

A gap between clusters should be filled based on maximum gradient following until the next cluster is encountered. If a "T" junction or a "bubble" is encountered, the branch along which the average gradient is greatest is used for polygon generation.

Polygon generation is a multi-pass procedure applied to the 4 connected binary edge image. Each pass consists of two steps:

(i) Complex polygons are processed.

If during polygon generation, an end-point is encountered that is not equal to the start point, a polygon closing error is declared and linking procedure begins. Linking is based on following of maximal gradient until the next cluster is encountered. If after a certain amount of steps no cluster is found, the current polygon is placed to the warning level. Pixels of clusters processed are preferably set to 0 to avoid double processing during subsequent passes and marked as used. Branches of "T" junctions and "bubbles" which were not used for polygon generation remain unchanged for processing during the next pass.

(ii) Remaining minimum size clusters are processed.

Those clusters which are marked as unused and of the size less than minimum size are not taken into consideration and are marked as used.

Polygon generation process flow is comprised of the following sequential steps:

(i) Identify and uniquely label all edge clusters.

(ii) generate polygons starting with complex polygon category clusters.

(iii) repeat (ii) until polygons have been generated for all complex polygon clusters.

(iv) generate polygons for minimum size polygon category clusters.

(v) repeat (i)–(iv) until no new polygons have been generated.

(vi) classify closed polygons according to their dimensions (complex polygons and minimum size polygons) and write data to an appropriate layer database.

(vii) write polygons which are not closed, to a warning layer.

Once the polygon data has been generated, an image mosaicking process should be used to generate a hierarchical tiled mosaic of the image set associated with one layer. The images that make up the mosaic are maintained as abutting "cells" as opposed to being merged onto one seamless image. This approach was chosen so that a modestly priced computer work station could be used to perform the mosaicking function if desired.

Figure 10:
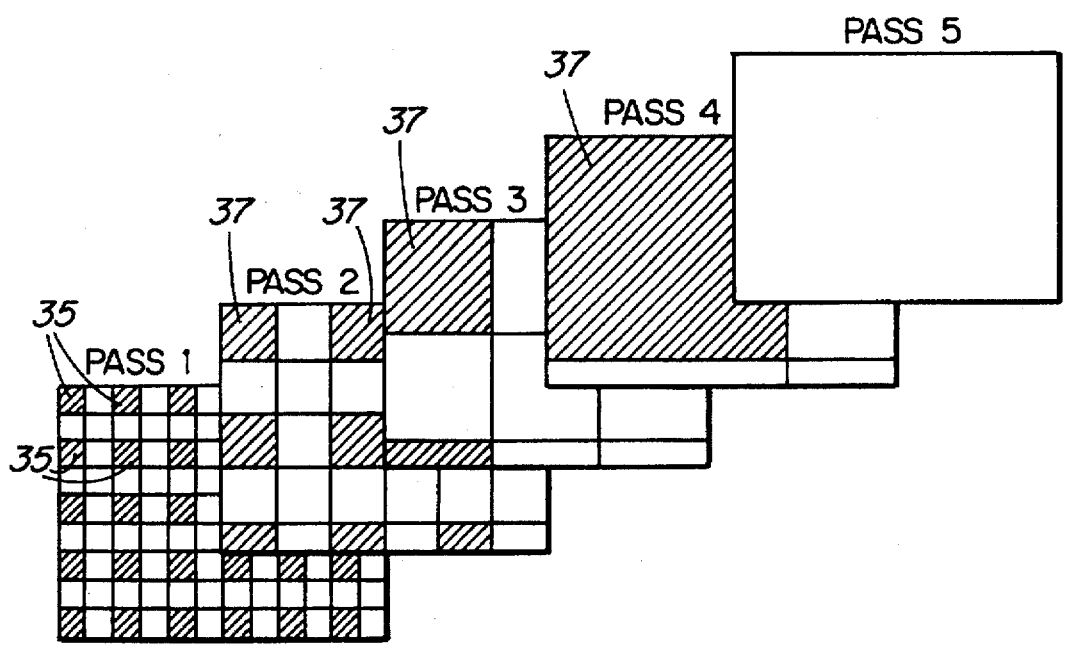

In general, as shown in FIG. 10, the mosaicking process is multi-pass wherein during each pass, images 35 are mosaicked in groups of four thereby collapsing the number of images in an image set by four times every mosaicking pass/level. The mosaicking continues until the original image set is collapsed to an image set equal to 1 image (e.g. pass 5). The resulting mosaicked image is constructed of tiles of image "cells" 37 (or is hierarchical in nature) where each cell 37 of level "n" is represented by four cells of level "n−1".

This process has been found to minimize the accumulation and propagation of registration errors and is amenable to parallel processing.

The hashed image in FIG. 10 represents the reference image for a quad image set at each level.

Image registration and mosaicking are comprised of the following processes:

(i) Quad selection (ii) Quad XY offset calculation (iii) Exception identification (iv) Exception handling, and (v) Quad overlap elimination.

Figure 11:
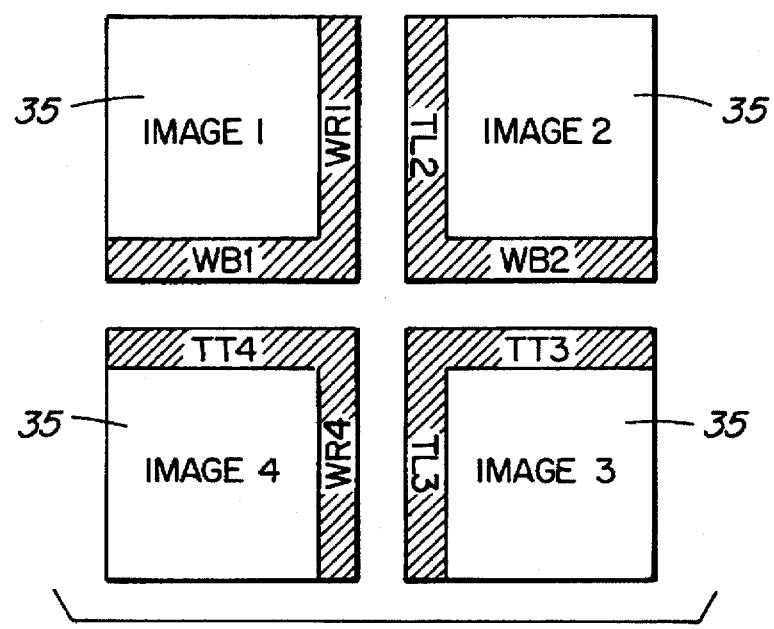

With reference to FIG. 11, the Quad selection process is used to select a set of four images 35 which will be mosaicked and to create sub-images for each image at overlapping boundaries between the adjacent images.

The use of sub-images has been determined to significantly reduce the amount of memory required to perform mosaicking. "Window" sub-images should be created for the right edges WR1, WR4 of images 1 and 4 and the bottom edges WB1, WB2 of images 1 and 2. "Template" sub-images should be created for the left edge TL2, TL3 of images 2 and 3 and the top edge TT3, TT4 of images 3 and 4. Overlap between adjacent images are defined so that the "template" sub-image images are always a subset of the corresponding "window" images e.g. TL2CWR1.

Quad XY offset calculation determines the XY offsets that produce the least error between two adjacent images. Quad XY offset calculation determines four optimal XY offset values or ranges of values for each of WR1/TL2, WB2/TT3, WR4/TL3 and WB1/TT4 adjacent sub-image pairs.

Figure 12:
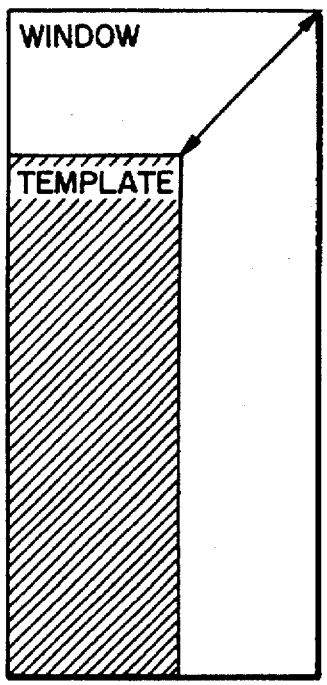
Figure 13:
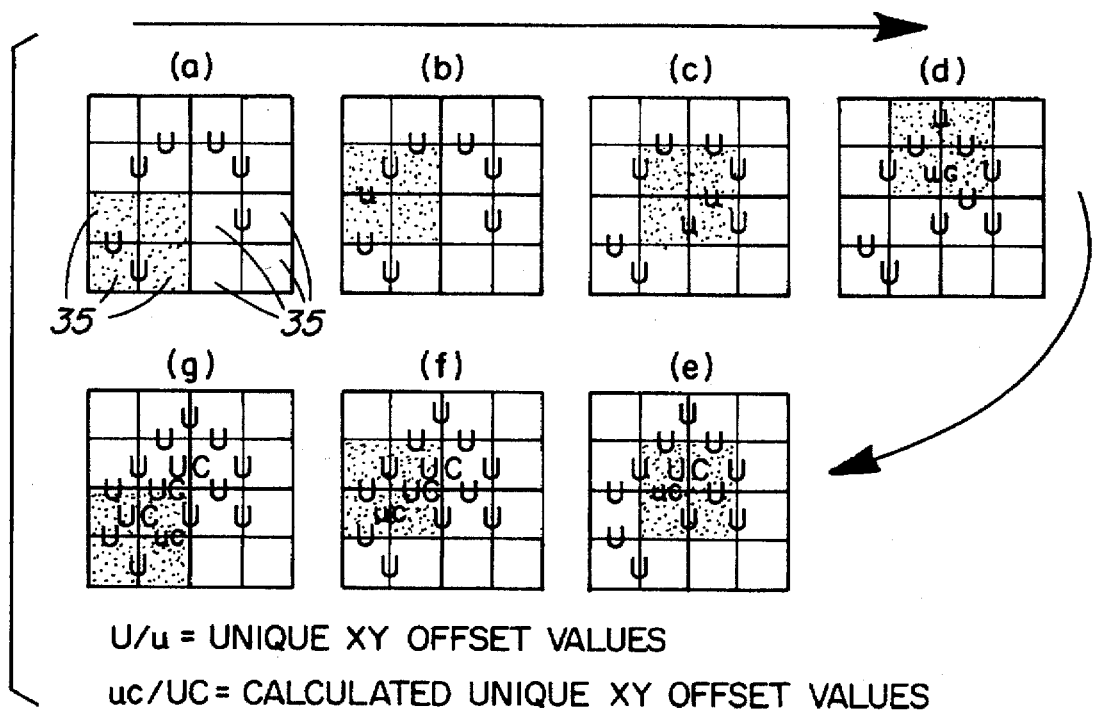

The process used determines minimum difference error registration using co-ordinates of vector/polygon data. The window sub-images should be clipped to the same size as the corresponding template sub-image as shown in FIG. 12 and the difference in the vertices accumulated. Difference values should be calculated for all XY displacements of the template size image in the window size image.

Exception identification determines whether there are a sufficient number of unique XY offsets in order to be able to mosaic the Quad image set. If there is a sufficient number, the exception identifier process passes the data to the quad overlap elimination process for further processing. If there is an insufficient number, all relevant data is stored for later processing by the exception handler.

As shown in the charts below, a sufficient number of unique XY offsets (other than 4) are defined as follows:
(i) for 3 unique offsets, the fourth XY Offset value is calculated using the other three offsets.
(ii) for 2 unique offsets, the XY offset data is examined to identify whether the following special cases exist and if they do, the two remaining XY offset values calculated.

Case 1:

| Case 1a | Case 1b | X Co-ordinate | Y Co-ordinate |
|---|---|---|---|
| Image 1 | Image 0 | u | u |
| Image 2 | Image 1 | x | u |
| Image 3 | Image 2 | u | u |
| Image 0 | Image 3 | u | x | u - unique XY Offset value; x - don't care

| Case 1c Image # | Case 1d Image # | X Co-ordinate | Y Co-ordinate |
|---|---|---|---|
| 1 | 0 | u | u |
| 2 | 1 | u | x |
| 3 | 2 | u | u |
| 0 | 3 | x | u | u - unique XY Offset value; x - don't care

Case 2:

| Case 2a Image # | Case 2b Image # | Case 2c Image # | Case 2d Image # | X Co-ordinate | Y Co-ordinate |
|---|---|---|---|---|---|
| 3 | 2 | 1 | 0 | u | u |
| 2 | 1 | 0 | 1 | u | u |
| 1 | 0 | 3 | 2 | u | x |
| 0 | 3 | 2 | 3 | x | u | u - unique XY Offset value; x - don't care

Case 2:

| Case 2e Image # | Case 2f Image # | Case 2g Image # | Case 2h Image # | X Co-ordinate | Y Co-ordinate |
|---|---|---|---|---|---|
| 3 | 2 | 1 | 0 | u | u |
| 2 | 1 | 0 | 1 | u | u |
| 1 | 0 | 3 | 2 | x | u |
| 0 | 3 | 2 | 3 | u | x | u - unique XY Offset value; x - don't care

The exception handling process calculates indirectly the two or more unique XY Offset data values required to successfully complete mosaicking of a Quad image set.

With reference to FIGS. 13(a)–13(g), this is accomplished by:
(i) examining a mosaicked quad image 35 set four-way connected to the exception quad image set currently being examined (FIG. 13(a)).
(ii) identifying which adjacent mosaicked quad image set has an unique XY offset value bordering the exception quad image set and pushing the exception quad image set data onto a exception stack.
(iii) creating a new quad image set consisting of two images from each of the exception quad image set and quad image set of (ii) adjacent to the border identified in (ii), as shown in FIG. 12(b).
(iv) executing an XY offset calculation on the image created in (iii) (FIG. 12(b)).
(v) executing the exception identification.
(vi) if an exception exists, push the new exception quad image data (new quad image set of (v)) onto the exception stack and repeat (i)–(v) (FIG. 13(c)).
(vii) if an exception does not exist (FIG. 13(d)), pop the stack and calculate indirectly the XY offsets of the previous exception quad image set (FIG. 13(e)).
(viii) repeat (vii) until the exception stack is empty (and remaining XY offset values for the original exception quad image set have been indirectly calculated (FIGS. 13(f) and 13(g)).

Quad Overlap Elimination eliminates the overlap between adjacent images within a quad image set by removing any overlap information from image 1 right and bottom edges, Image 2 bottom edge and image 4 right edge (FIG. 11). The process removes overlap data from images which results in no change in the origin of the image for any of the four images.

In addition, this process creates a hierarchical "cell", the contents of which contain image reference identifiers and XY co-ordinate placement information for each reference identifier.

Figure 14:
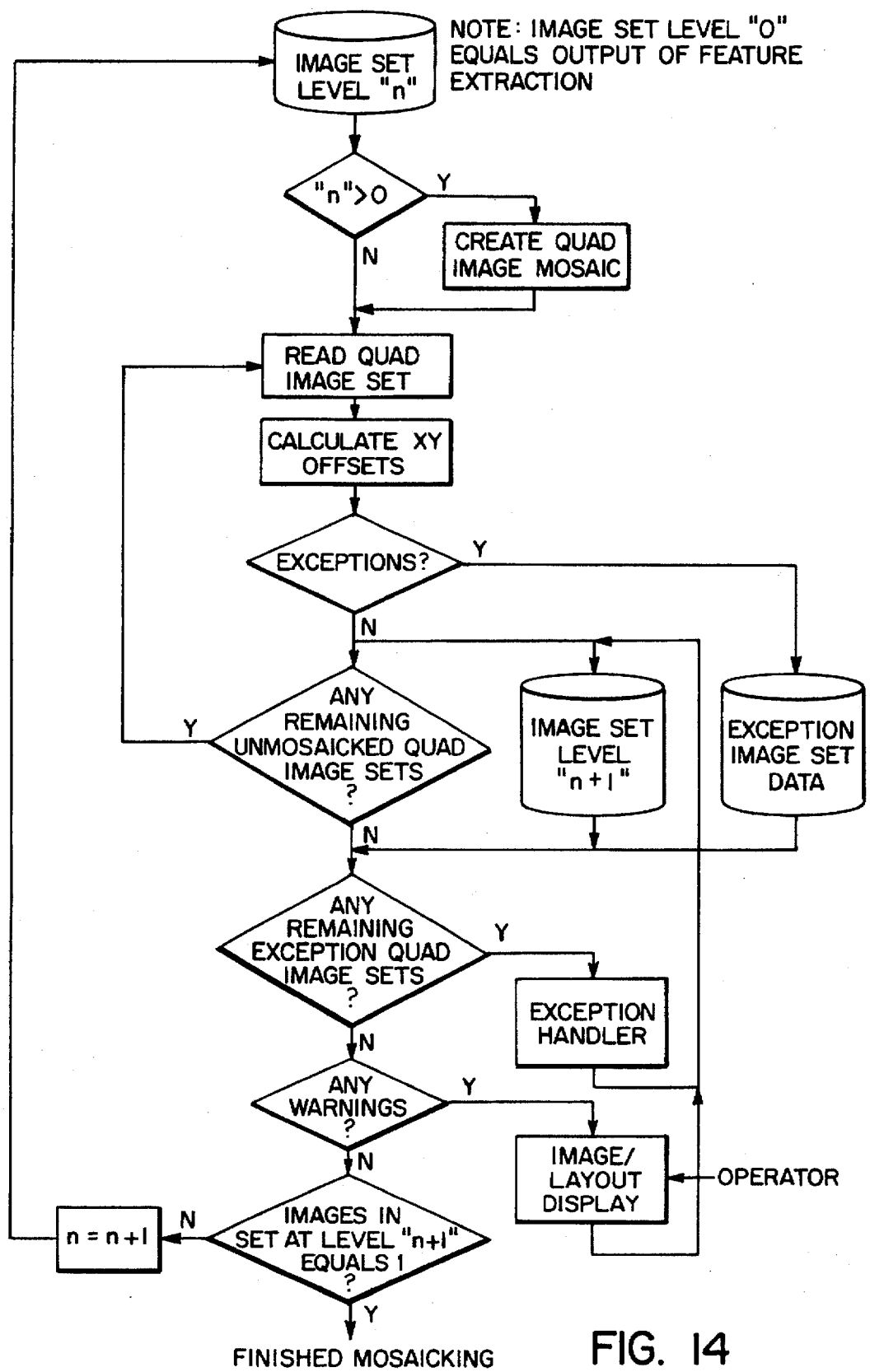

The mosaicking process thus is comprised of the following step, as shown in the flow chart of FIG. 14:
(i) If "n">φ, create a quad image mosaic by eliminating overlap between polygon images or cells (level n) and create a cell at the current pass level (level n+1).
(ii) identify a quad image set, read in polygon image and/or previous pass level cells (level n) database data and generate sub-images.
(iii) using sub-images of (ii), calculate the XY offsets between adjacent image cells (level n).
(iv) determine whether a sufficient number of unique XY offsets exists.
(v) if a sufficient number of XY offsets do not exist, store the quad image set data in an exception image set data file.

(vi) repeat (i)–(v) until all image cells (level n) have been processed.

(vii) if exceptions exist, execute the exception handling process until all exceptions have been eliminated.

(viii) if the number of cells (level n) is greater than 1, increment the level number and repeat (i)–(vii).

If the number of "cells" at the current level is equal to 1, mosaicking is finished.

A layout reconstruction process creates an IC layout database consisting of the mosaicked image sets for each of the semiconductor layers, by vertically registering one layer to it's vertically adjacent layer in depth relative to the IC layers, re-defining the image boundaries so that the image boundaries do not cut through diffusion image regions and consolidating all layer databases associated with each image into a single database.

The layout reconstruction process is comprised of: (i) Vertical registration, and (ii) Layout cell generation.

The vertical registration process vertically aligns together each mosaicked layer image set. A minimum difference process is used to determine optimum registration using vias and/or contacts as control points.

Figure 15:
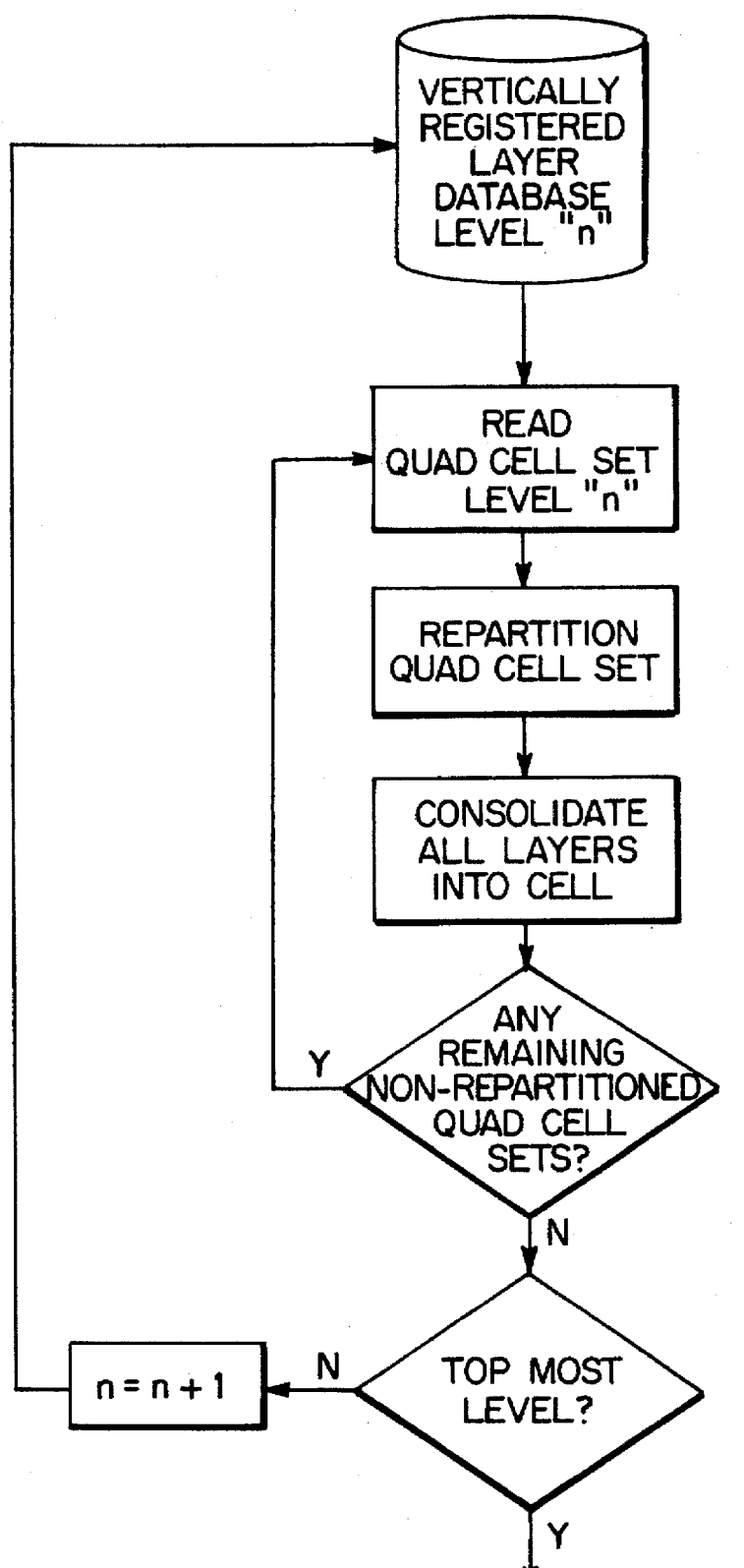
Figure 16:
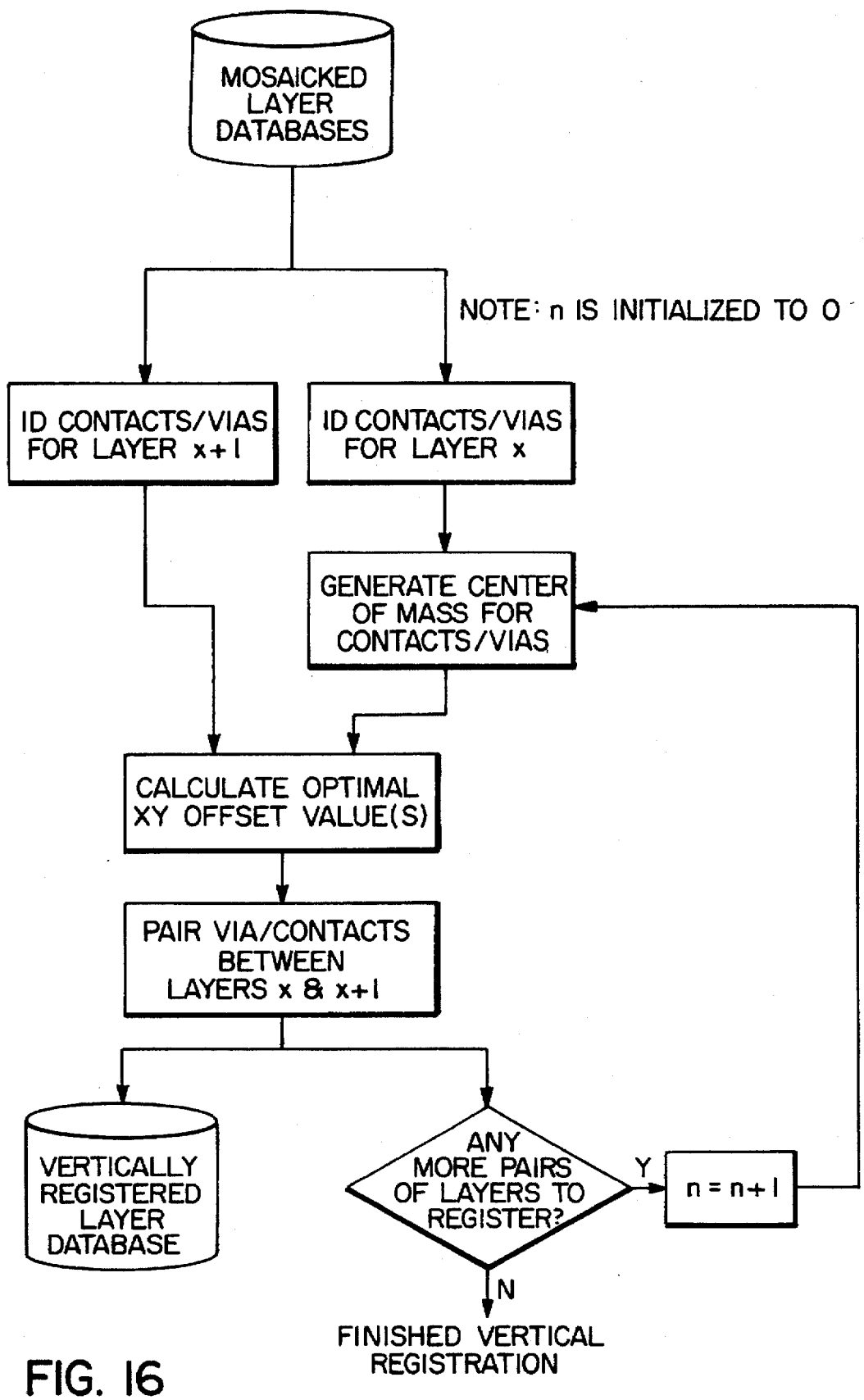

With reference to the flow chart of FIG. 15, vertical registration starts with the top most pair of layers and progresses down to diffusion. For each pair of layers, as the via/contact information of the pair of layers is read into a global co-ordinate system, images at the four corners, center of each edge and the center of the image set are vertically registered independently and the XY offset ranges are compared to identify an unique or range of unique offset values that satisfy the registration criteria for all eight image pairs.

A pair of images is defined as being registered when all the centers of mass for vias and/or contacts of the upper layer image lie within 1 grid spacing of the extent of all vias and/or contacts of the lower layer image. There should never be any further offset than 1 grid spacing. The upper layer is always defined as the layer with the fewer vias and/or contacts, i.e. for the M2/M1 metallization layer pair, M2 is defined as the upper layer.

Using the optimal XY offset value(s), each via and/or contact in the upper layer is paired with a corresponding via and/or contact in the immediately lower layer using the same registration criteria described above. If a center of mass for a via and/or contact in the upper layer has no correspondence on the lower layer, then a warning is flagged. When the registration criteria is met for a pair of layers, the corresponding via and/or contact in the lower pair of layers is deleted except for integrated circuit fabrication processes that allow for stacked vias and/or contacts. For stacked via integrated circuit processes, the via and/or contact data is retained but is moved to a different layer.

A layout cell generation process (i) redefines image and/or cell boundaries so that boundaries do not cut through diffusion regions, and (ii) consolidates all layer databases associated with an image/cell into one database i.e. create a layout database for a cell. The boundaries are re-partitioned so that a transistor level netlist can be extracted hierarchically, thus significantly reducing hardware requirements for the schematic generation system.

Boundary re-partitioning is generally similar to the process used for mosaicking. Boundary re-partitioning is a multi-pass process where the inner boundaries of a quad image set at each level are re-partitioned.

The re-partitioning process steps are as follows:

(i) for each image in a quad image set, locate diffusions (lowest image level) that touch the quad image set inner edges.

(ii) determine whether a diffusion crosses a quad image set inner edge into an adjacent image. If yes, measure the extent.

(iii) if the extent is greater than the extent in the current image, back off the boundary. Otherwise extend the boundary so that entire diffusion region lies wholly in one image.

(iv) determine whether the boundary can be displaced by a consistent value along the entire edge. If no, modify the boundary so that the edge follows the contour of the diffusion boundary that extends beyond the original boundaries and relocate all polygons into the appropriate image. If yes, extend the boundary and relocate all polygons into the appropriate image.

Once the new boundaries have been defined for the inner edges of the diffusion layer quad image set, the inner boundaries for the quad image sets of the other layer databases associated with the diffusion layer quad image set are adjusted to coincide with the inner boundaries of the diffusion layer quad image set and all layer data for each image in the quad image set is consolidated into a single "cell" database, in a format consistent with IC Layout database formats.

A special case exists for quad Image sets wherein one or more images are at the extent of the image set. This special case should be handled during the first pass after boundary re-partitioning. The edge(s) in the diffusion layer quad image set that are at the extent of the Image Set are extended to reflect the furthest extent of the polygons in the other layer databases associated with the diffusion image.

A schematic generation process generates a gate or higher level hierarchical schematic representation of the layout database. This process consists of three principal processes: (i) netlist extraction, (ii) hierarchy reconstruction, and (iii) schematic creation.

Commercial netlist extraction systems or software programs that can be operated by computer work stations are readily available from major IC EDA vendors i.e. Cadence, Mentor Graphics, Cascade and others, for example Model Dracula LPE sold by Cadence Design Systems, 555 River Oaks Parkway, San Jose, Calif., 95134, U.S.A. The netlist extraction process is well understood by those skilled in the semiconductor design art. "Rule files" are typically developed for different process technologies defining what constitutes the different elements, interconnectivity, etc. These rule files instruct the netlist extraction process how to interpret and convert the layout database into electrical elements and connectivity. The rule file for the particular process technology encountered (e.g. CMOS) for analysis of a particular IC should be used for the netlist extraction process.

A "hierarchical" netlist consistent with the "hierarchy" defined in the layout database should be extracted. This "hierarchical" netlist may have no resemblance to the actual gate or logic level hierarchy of the IC device analyzed by the present invention. The netlist is extracted "hierarchically" to simplify and lessen the hardware's software requirements of the hierarchy reconstruction process steps.

The hierarchy reconstruction process should create (as a minimum) a gate or cell level function hierarchical netlist from the transistor and element netlist generated by the netlist extraction process steps. This netlist should be converted in a format compatible with commercially available netlist-to-schematic generators.

The process steps can use a simple rule based approach whereby a library of rules files is defined for all of the common logic gates, analog functions and memory circuits.

A learning system can be used to effectively extract higher levels of hierarchy.

Hierarchy reconstruction should be performed "hierarchically" following the hierarchy inherent in the extracted netlist. It is preferred that the process should be as follows:

(i) starting at the lowest level of the netlist hierarchy, for each "cell" at the current level extract all elements defined by the library of rule files.

For all groups of elements identified and extracted, add an additional lower level of hierarchy, move these elements to that lower level and add a hierarchical identifier representing the function of these elements in the cell at the current level.

If there are any remaining un-extracted elements move those elements to the next higher level hierarchical cell.

(ii) repeat (i) for all cells at the current level of hierarchy.

(iii) repeat (i)–(ii) for the next higher level of hierarchy.

(iv) repeat (i)–(iii) until the highest level hierarchy has been completed.

A schematic creation process should synthesis a graphical schematic database from the hierarchy reconstructed netlist. Commercial schematic synthesis tools are readily available from major IC EDA vendors i.e. Cadence, Mentor Graphics and others and is typically available as part of their design entry modules. For example, a computer software program to perform schematic synthesis from the netlist is sold under the name ViewGen by Viewlogic Systems Inc., 293 Boston Post Road West, Marboro, Mass., 01752-4615, U.S.A. The schematic synthesis process is well understood by those skilled in the art and is virtually a "push button" operation once a compatible netlist is available. The resulting graphical schematic database can be edited using the schematic capture tool provided by the EDA vendor and/or exported (for editing on other vendor's schematic capture tools).

A person understanding this invention may now conceive of alternative structures and embodiments or variations of the above. All of those which fall within the scope of the claims appended hereto are considered to be part of the present invention.

We claim:

1. A method of analyzing at least a portion of an integrated circuit (IC) comprising the steps of automatically:

(a) scanning at least a portion of a layer of an integrated circuit using high magnification to provide first digital signals representing pixel amplitudes, (b) extracting features of interest from the first digital signals to provide second digital signals representing values of groups of pixels defining said features of interest, (c) modifying said second digital signals representing adjacent features of interest from step (b) so as to mosaic the features of interest and providing third signals representing a seamless representation of said layer, (d) repeating steps (a), (b) and (c) for other layers of the integrated circuit, whereby plural third signals representing plural ones of said layers are provided, (e) registering said plural third signals relative to each other so as to represent vertical alignment of said layers by determining features of interest representative of IC mutual interconnection locations between layers, and using said locations as control points for said registering, and establishing an integrated circuit layout database therefrom, (f) generating a netlist from data signals defining said cells, and (g) generating a schematic diagram of a circuit contained in the integrated circuit from the said netlist.

2. A method as defined in claim 1, including determining features of interest representative of IC diffused regions for transistors, defining cells having boundaries which fully contain diffused regions and which avoid intersecting diffused regions prior to generating said netlist.

3. A method as defined in claim 1 in which the step of extracting features is comprised of reducing or eliminating background information other than features of interest, and including the further step of computing a plurality of polygons in place of said groups of pixels for representation by said second digital signal.

4. A method as defined in claim 3, in which the step of mosaicking is comprised of:

(i) selecting data representing a set of four images representing adjacent features of interest, (ii) computing mutually orthogonal (x,y) coordinate offsets between two adjacent images in each said set of four images which minimizes registration error between image pairs, (iii) substracting said offsets and computing overlap between image pairs in each said set of four images after substracting said offsets, whereby a cell representation signal of said four images is obtained as representations of said adjacent features of interest, (iv) determinining, from computation of said offsets, whether a sufficient number of unique x, y, coordinate offsets exists to define a cell, and in the event there is an insufficient number, indirectly determining missing x, y offsets prior to step (iii).

5. A method as defined in claim 1 in which the step of extracting features is comprised of separating signals representing foreground data from said first digital signals and converting the separated signals into a data signal representing linked edges of each said features.

6. A method as defined in claim 5 in which the separating step is comprised of determining image regions of approximately uniform appearance of at least one of intensity and slope.

7. A method as defined in claim 5 in which the separating step is comprised of stretching contrast of pixel values of the second digital signals in a non-linear manner, and processing resulting digital signals through a Sobel filter, to provide replacement second digital signals.

8. A method as defined in claim 5 in which the separating step is comprised of replacing the value of each pixel by a value representing the dispersion of intensity in a surrounding area defined by a kernel size, to provide replacement second digital signals.

9. A method as defined in claim 8 including the step of non-linear stretching of a contrast value of each kernel in a medium range of intensity whereby contrast of low-contrast features of interest is enhanced.

10. A method as defined in claim 8 including comparing each dispersed intensity value with a threshold, and linking signals in excess of the threshold which are less than a maximum distance apart.

11. A method as defined in claim 8 including comparing each dispersed intensity value with a high and a medium intensity range, then non-linear stretching of the intensity values within the medium intensity ranges to increase the average difference of intensity between noise and low contrast features of interest, comparing the stretched intensity values with a further threshold to extract low contrast features which are above the further threshold, and combining the extracted features that are above the further threshold with the intensity values within the high intensity range to provide said replacement second digital signals.

12. A method as defined in claim 5 in which the step of converting the separated signals is comprised of identifying clusters of contiguous pixels representing said linked edges, and defining polygon vertices based on running directions of said clusters, to define said data signals representing linked edges of said clusters.

13. A method as defined in claim 1 including defining an uppermost layer relative to an integrated circuit substrate, registering pairs of layers from the uppermost layer to a lowermost diffusion layer based on centers of said interconnection locations of said layers being aligned with a minimum error, and storing resulting coordinates of the features of interest of all layers relative to a global coordinate system for provision to a netlist generating process.

14. A method as defined in claim 13 including flagging the coordinates of said interconnection locations which have no corresponding ones of said interconnection locations in a lower layer.

15. A method as defined in claim 1 in which said mutual interconnection locations are comprised of vias or contacts.

16. A method of analyzing at least a portion of an integrated circuit (IC) comprising the of automatically:
   (a) scanning at least a portion of a layer of an integrated circuit using high magnification to provide first digital signals representing pixel amplitudes,
   (b) extracting features of interest representative of IC mutual interconnection locations between layers from the first digital signals to provide second digital signals representing values of groups of pixels defining said features of interest;
   (c) modifying said second digital signals representing adjacent features of interest from step (b) so as to mosaic the features of interest and providing third signals representing a seamless representation of said layer by
      (i) selecting data representing a set of four images representing adjacent features of interest,
      (ii) computing mutually orthogonal (x,y) coordinate offsets between two adjacent images in each said set of four images which minimizes registration error between image pairs,
      (iii) determining, from computation of said offsets, whether a sufficient number of unique x, y coordinate offsets exists to define a cell, and in the event there is an insufficient number, indirectly determining missing x, y offset,
      (iv) subtracting said offsets and computing overlap between image pairs in said set of four images after subtracting said offsets,
   whereby a cell representation signal of said four images is obtained as representations of said adjacent features of interest,
   (d) repeating steps (a), (b) and (c) for other layers of the integrated circuit, whereby plural third signals representing plural ones of said layers are provided,
   (e) registering said plural third signals relative to each other so as to represent vertical alignment of said layers, and establishing an integrated circuit layout database therefrom, and
   (f) generating a schematic diagram of a circuit contained in the integrated circuit from the said database.

17. A method as defined in claim 16 in which the step of extracting features is comprised of reducing or eliminating background information other than features of interest, and including the further step of computing a plurality of polygons in place of said groups of pixels for representation by said second digital signal.

18. A method as defined in claim 16, including repeating steps (i), (ii), and (iii) repeatedly using cells resulting from step (iii) as image in step (i).

19. A method as defined in claim 18, wherein the selecting step is comprised of determining the coordinates of the right edges of adjacent features of a left-hand pair of the four images along a y axis (WR1, WR4), determining the coordinates of the bottom edges of adjacent features of a top pair of the four images along an x axis (W1, WB2), determining the coordinates of the left edges of the right hand pair of the four images (TL2, TL3) and determining the coordinates of the top edges of the bottom pair of the four images (TT4, TT3), and storing said coordinates as representations of said images.

20. A method as defined in claim 19 including computing said overlap relative to the TL(N) coordinates and clipping the corresponding image.

21. A method as defined in claim 20 including clipping the WR(N) image coordinate with the same overlap values as the TL(N) image coordinates.

22. A method as defined in claim 16 in which the step of extracting features is comprised of separating signals representing foreground data from said first digital signals and converting the separated signals into a data signal representing linked edges of each said features.

23. A method as defined in claim 22 in which the separating step is comprised of determining image regions of approximately uniform appearance of at least one of intensity and slope.

24. A method as defined in claim 22 in which the step of converting the separated signals is comprised of identifying clusters of contiguous pixels representing said linked edges, and defining polygon vertices based on running directions of said clusters, to define said data signals representing linked edges of said clusters.

25. A method as defined in claim 22 in which the separating step is comprised of stretching contrast of pixel values of the second digital signals in a non-linear manner, and processing resulting digital signals through a Sobel filter, to provide replacement second digital signals.

26. A method as defined in claim 22 in which the separating step is comprised of replacing the value of each pixel by a value representing the dispersion of intensity in a surrounding area defined by a kernel size, to provide replacement second digital signals.

27. A method as defined in claim 26 including comparing each dispersed intensity value with a threshold, and linking signals in excess of the threshold which are less than a maximum distance apart.

28. A method as defined in claim 26 including comparing each dispersed intensity value with a high and a medium intensity range, then non-linear stretching of the intensity values within the medium intensity ranges to increase the average difference of intensity between noise and low contrast features of interest, comparing the stretched intensity values with a further threshold to extract low contrast features which are above the further threshold, and combining the extracted features that are above the further threshold with the intensity values within the high intensity range to provide said replacement second digital signals.

29. A method as defined in claim 26 including the step of non-linear stretching of a contrast value of each kernel in a medium range of intensity whereby contrast of low-contrast features of interest is enhanced.

30. A method as defined in claim 16, comprising the steps of:
   (a) eliminating background information other than features of interest, and
   (b) computing a plurality of polygons in place of said groups of pixels for representation by said first digital signals.

31. A method of analyzing at least a portion of an integrated circuit comprising the steps of automatically:
   (a) scanning small portions of at least a portion of a layer of an IC using high magnification, to obtain stored images of said portions of the IC,
   (b) converting said stored images to polygon data
   (c) assembling the polygon data in mosaicked image sets,
   (d) repeating steps (a), (b) and (c) for plural layers of the IC,
   (e) registering the mosaicking image sets into alignment, and
   (f) generating a schematic diagram of circuitry represented by at least a portion of the IC from the aligned mosaicked image sets,
   in which step (c) is comprised of:
      (i) selecting data representing a set of four images representing adjacent features of interest,
      (ii) computing mutually orthogonal (x,y) coordinate offsets between two adjacent images in said set of four images which minimizes registration error between image pairs, and
      (iii) substracting said offsets and computing overlap between image pairs in said set of four images after substracting said offsets,
      whereby a cell representation signal of said four images is obtained as representations of said adjacent features of interest.

32. A method as defined in claim 31 including removing overlap between the stored images during step (c) so as to provide data representing a seamless mosaicked image.

33. A method as defined in claim 32 including modifying data representing boundaries of an image set so as to avoid crossing a boundary of a diffusion region defined in an image set.

34. A method as defined in claim 33 including defining first cells of four mosaicked adjacent images, defining second cells of four mosaicked adjacent cells, and defining further cells of four mosaicked lower order cells, and storing data requesting a highest order of four mosaicked lower order cells prior to carrying out step (f).

35. A method of analyzing at least a portion of an integrated circuit which has been scanned, and images adjacent or overlapping regions of the integrated circuit stored, comprising the steps of:
   (i) selecting data representing a set of four images representing adjacent features of interest,
   (ii) computing mutually orthogonal (x,y) coordinate offsets between two adjacent images in said set of four images which minimizes registration error between image pairs,
   (iii) substracting said offsets and computing overlap between image pairs in said set of four images after substracting said offsets,
   whereby a cell representation signal of said four images is obtained as representations of said adjacent features of interest,
   (iv) determining, from computation of said offsets, whether of sufficient number of unique x, y coordinate offsets exists to define a cell, and in the event there is an insufficient number, indirectly determining missing x, y offsets prior to step (iii).

36. A method as defined in claim 35, wherein the selecting step is comprised of determining the coordinates of the right edges of adjacent features of a left-hand pair of the four images along a y axis (WR1, WR4), determining the coordinates of the bottom edges of adjacent features of a top pair of the four images along an x axis (WB1, WB2), determining the coordinates of the left edges of the right hand pair of the four images (TL2, TL3) and determining the coordinates of the top edges of the bottom pair of the four images (TT4, TT3), and entering said coordinates as representations of said images.

37. A method as defined in claim 36 including computing said overlap relative to the TL(N) coordinates and clipping the corresponding image.

38. A method as defined in claim 37 including clipping the WR(N) image coordinate with the same overlap values as the TL(N) image coordinates.

39. A method of analyzing at least a portion of an integrated circuit which has been scanned to produce first digital signals representing pixel amplitudes, and images of adjacent or overlapping regions of the integrated circuit in a form of said first digital signals stored, comprising the steps of:
   (a) extracting features of interest from the first digital signals to provide second digital signals representing values of groups of pixels defining said features of interest,
   (b) separating signal representing foreground data from said digital signals and connecting the separated signals into a data signal representing linked edges of each of said features.

40. A method as defined in claim 39 in which the separating step is comprised of determining image regions of approximately uniform appearance of at least one of intensity and slope.

41. A method as defined in claim 39 in which the separating step is comprised of stretching contrast of pixel values of the second digital signals in a non-linear manner, and processing resulting digital signals through a Sobel filter, to provide replacement second digital signals.

42. A method as defined in claim 39 in which the separating step is comprised of replacing the value of each pixel by a value representing the dispersion of intensity in a surrounding area defined by a kernel size, to provide replacement second digital signals.

43. A method as defined in claim 42 including the step of non-linear stretching of a contrast value of each kernel in a medium range of intensity whereby contrast of low-contrast features of interest is enhanced.

44. A method as defined in claim 42 including comparing each dispersed intensity value with a threshold, and linking signals in excess of the threshold which are less than a maximum distance apart.

45. A method as defined in claim 42 including comparing each dispersed intensity value with a high and a medium intensity range, then non-linear stretching of the intensity values within the medium intensity ranges to increase the average difference of intensity between noise and low contrast features of interest, comparing the stretched intensity values with a further threshold to extract low contrast features which are above the further threshold, and combining the extracted features that are above the further threshold with the intensity values within the high intensity range to provide said replacement second digital signals.

46. A method as defined in claim 39 in which the step of converting the separated signals is comprised of identifying clusters of contiguous pixels representing said linked edges, and defining polygon vertices based on running directions of said clusters, to define said data signals representing linked edges of said clusters.

47. A method as defined in claim 39 including repeating each of steps (a) and (b) on digital signals representing each layer of the integrated circuit.

* * * * *